(12) United States Patent
Matsuzaki et al.

(10) Patent No.: US 10,453,846 B2
(45) Date of Patent: *Oct. 22, 2019

(54) SEMICONDUCTOR DEVICE

(71) Applicant: Semiconductor Energy Laboratory Co., Ltd., Atsugi-shi, Kanagawa-ken (JP)

(72) Inventors: Takanori Matsuzaki, Kanagawa (JP); Shuhei Nagatsuka, Kanagawa (JP); Hiroki Inoue, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/287,285

(22) Filed: May 27, 2014

(65) Prior Publication Data

US 2014/0264521 A1 Sep. 18, 2014

Related U.S. Application Data

(63) Continuation of application No. 13/230,093, filed on Sep. 12, 2011, now Pat. No. 8,767,442.

(30) Foreign Application Priority Data

Sep. 13, 2010 (JP) .................. 2010-204419

(51) Int. Cl.
*G11C 11/24* (2006.01)
*H01L 27/105* (2006.01)
(Continued)

(52) U.S. Cl.
CPC ............ *H01L 27/1052* (2013.01); *G11C 8/08* (2013.01); *G11C 11/403* (2013.01);
(Continued)

(58) Field of Classification Search
CPC ............ H01L 27/1052; G11C 16/0433; G11C 11/405; G11C 16/08; G11C 16/02;
(Continued)

(56) References Cited

U.S. PATENT DOCUMENTS 4,466,081 A 8/1984 Masuoka
4,546,273 A * 10/1985 Osman ............. H03K 19/17712
326/106

(Continued)

FOREIGN PATENT DOCUMENTS

EP 0116287 A 8/1984
EP 1120791 A 8/2001
(Continued)

OTHER PUBLICATIONS

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.
(Continued)

*Primary Examiner* — Tha-O H Bui
(74) *Attorney, Agent, or Firm* — Fish & Richardson P.C.

(57) ABSTRACT

A semiconductor device in which stored data can be held even when power is not supplied and there is no limitation on the number of writing operations is provided. A semiconductor device is formed using a material which can sufficiently reduce the off-state current of a transistor, such as an oxide semiconductor material that is a wide-gap semiconductor. When a semiconductor material which can sufficiently reduce the off-state current of a transistor is used, the semiconductor device can hold data for a long period. In addition, by providing a capacitor or a noise removal circuit electrically connected to a write word line, a signal such as a short pulse or a noise input to a memory cell can be reduced or removed. Accordingly, a malfunction in which
(Continued)

data written into the memory cell is erased when a transistor in the memory cell is instantaneously turned on can be prevented.

15 Claims, 16 Drawing Sheets

(51) Int. Cl.
| | |
|---|---|
| G11C 8/08 | (2006.01) |
| G11C 11/403 | (2006.01) |
| G11C 11/405 | (2006.01) |
| G11C 11/408 | (2006.01) |
| G11C 16/02 | (2006.01) |
| G11C 16/04 | (2006.01) |
| G11C 16/08 | (2006.01) |

(52) U.S. Cl.
CPC ........ *G11C 11/405* (2013.01); *G11C 11/4085* (2013.01); *G11C 16/02* (2013.01); *G11C 16/0433* (2013.01); *G11C 16/0483* (2013.01); *G11C 16/08* (2013.01); *G11C 2211/4016* (2013.01)

(58) Field of Classification Search
CPC ............... G11C 11/403; G11C 11/4085; G11C 16/0483; G11C 8/08; G11C 2211/4016
USPC .................... 365/129, 149, 230.05
See application file for complete search history.

(56) References Cited

U.S. PATENT DOCUMENTS

| | | | |
|---|---|---|---|
| 4,610,002 A | 9/1986 | Kaneko | |
| 4,639,622 A * | 1/1987 | Goodwin | G11C 8/08 326/88 |
| 4,771,323 A * | 9/1988 | Sasaki | G11C 11/404 257/377 |
| 5,349,366 A | 9/1994 | Yamazaki et al. | |
| 5,612,924 A | 3/1997 | Miyamoto | |
| 5,696,731 A * | 12/1997 | Miyamoto | G11C 8/08 365/203 |
| 5,731,856 A | 3/1998 | Kim et al. | |
| 5,744,864 A | 4/1998 | Cillessen et al. | |
| 5,883,829 A * | 3/1999 | van der Wagt | B82Y 10/00 257/197 |
| 6,127,702 A | 10/2000 | Yamazaki et al. | |
| 6,160,747 A | 12/2000 | Brox et al. | |
| 6,294,274 B1 | 9/2001 | Kawazoe et al. | |
| 6,314,017 B1 * | 11/2001 | Emori | G11C 11/405 257/296 |
| 6,515,892 B1 * | 2/2003 | Itoh | G11C 11/405 365/149 |
| 6,563,174 B2 | 5/2003 | Kawasaki et al. | |
| 6,714,479 B2 | 3/2004 | Takahashi et al. | |
| 6,727,522 B1 | 4/2004 | Kawasaki et al. | |
| 6,762,951 B2 | 7/2004 | Itoh et al. | |
| 6,809,989 B2 | 10/2004 | Takahashi et al. | |
| 6,876,569 B2 | 4/2005 | Itoh et al. | |
| 7,023,721 B2 | 4/2006 | Itoh et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,468,901 B2 | 12/2008 | Kameshiro et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,859,889 B2 | 12/2010 | Kameshiro et al. | |
| 8,300,031 B2 | 10/2012 | Kimura | |
| 8,344,435 B2 | 1/2013 | Saito | |
| 8,530,246 B2 | 9/2013 | Ofuji et al. | |
| 8,767,442 B2 * | 7/2014 | Matsuzaki | G11C 8/08 365/129 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0151964 A1 | 8/2003 | Takahashi et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0264279 A1 * | 12/2004 | Wordeman | G11C 11/40603 365/230.05 |
| 2005/0017302 A1 | 1/2005 | Hoffman | |
| 2005/0162894 A1 | 7/2005 | Itoh et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0227648 A1 * | 10/2006 | Kameshiro | G11C 7/18 365/230.05 |
| 2006/0228974 A1 | 10/2006 | Thelss et al. | |
| 2006/0231882 A1 | 10/2006 | Kim et al. | |
| 2006/0238135 A1 * | 10/2006 | Kimura | G09G 3/20 315/169.3 |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0237687 A1 * | 10/2008 | Kim | B82Y 10/00 257/316 |
| 2008/0254569 A1 | 10/2008 | Hoffman et al. | |
| 2008/0258139 A1 | 10/2008 | Ito et al. | |

(56) References Cited

U.S. PATENT DOCUMENTS

| | | |
|---|---|---|
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0166616 A1 | 7/2009 | Uchiyama |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2011/0076790 A1 | 3/2011 | Ofuji et al. |
| 2011/0101351 A1 | 5/2011 | Yamazaki |
| 2011/0121878 A1 | 5/2011 | Kato et al. |
| 2011/0122670 A1 | 5/2011 | Yamazaki et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156025 A1 | 6/2011 | Shionoiri et al. |
| 2011/0156027 A1 | 6/2011 | Yamazaki et al. |
| 2011/0156028 A1 | 6/2011 | Yamazaki et al. |
| 2011/0156117 A1 | 6/2011 | Yamazaki et al. |
| 2011/0157961 A1 | 6/2011 | Yamazaki et al. |
| 2014/0175437 A1 | 6/2014 | Uchiyama |

FOREIGN PATENT DOCUMENTS

| | | | |
|---|---|---|---|
| EP | 1293986 A | | 3/2003 |
| EP | 1329896 A | | 7/2003 |
| EP | 1737044 A | | 12/2006 |
| EP | 2226847 A | | 9/2010 |
| JP | 57-105889 A | | 7/1982 |
| JP | 59-161129 A | | 9/1984 |
| JP | 60-198861 A | | 10/1985 |
| JP | 62-274773 A | | 11/1987 |
| JP | 63-070558 A | | 3/1988 |
| JP | 63-210022 A | | 8/1988 |
| JP | 63-210023 A | | 8/1988 |
| JP | 63-210024 A | | 8/1988 |
| JP | 63-215519 A | | 9/1988 |
| JP | 63-239117 A | | 10/1988 |
| JP | 63-265818 A | | 11/1988 |
| JP | 63-268184 A | | 11/1988 |
| JP | 05-119298 A | | 5/1993 |
| JP | 05-251705 A | | 9/1993 |
| JP | 07-282590 A | | 10/1995 |
| JP | 08-264794 A | | 10/1996 |
| JP | 11-505377 | | 5/1999 |
| JP | 2000-044236 A | | 2/2000 |
| JP | 2000-113683 A | | 4/2000 |
| JP | 2000-150900 A | | 5/2000 |
| JP | 2001-053167 A | | 2/2001 |
| JP | 2001053167 A | * | 2/2001 |
| JP | 2001-307485 A | | 11/2001 |
| JP | 2002-042460 A | | 2/2002 |
| JP | 2002-076356 A | | 3/2002 |
| JP | 2002-093924 A | | 3/2002 |
| JP | 2002-289859 A | | 10/2002 |
| JP | 2002-368226 A | | 12/2002 |
| JP | 2003-086000 A | | 3/2003 |
| JP | 2003-086808 A | | 3/2003 |
| JP | 2004-103957 A | | 4/2004 |
| JP | 2004-273614 A | | 9/2004 |
| JP | 2004-273732 A | | 9/2004 |
| JP | 3781270 | | 5/2006 |
| JP | 2006-165532 A | | 6/2006 |
| JP | 2006-294116 A | | 10/2006 |
| JP | 2006-323376 A | | 11/2006 |
| JP | 2009-033145 A | | 2/2009 |
| JP | 2009-158663 A | | 7/2009 |
| JP | 2009-182194 A | | 8/2009 |
| JP | 2009-277702 A | | 11/2009 |
| JP | 2010-034091 A | | 2/2010 |
| JP | 2010-109338 A | | 5/2010 |
| WO | WO-2000/021092 | | 4/2000 |
| WO | WO-2002/009118 | | 1/2002 |
| WO | WO-2004/114391 | | 12/2004 |
| WO | WO-2009/139482 | | 11/2009 |
| WO | WO-2010/038601 | | 4/2010 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3-A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7,8,9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

(56) References Cited

OTHER PUBLICATIONS

Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTS) for AMLCDS", Journal of the SID, 2007, vol. 15, No. 1, pp. 17-22.
Park.S et al., "Challenge to Future Displays: Transparent AM-OLED Driven by Peald Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "Suftla Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits, 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTS and Their Application for Large Size AMOLED", AM-FDP '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-IN. AMOLED Display With Driver Circuit Using Amorphous In—Ga—Zn-Oxide TFTS", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 IN. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FDP '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41- 44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies In ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

(56) References Cited

OTHER PUBLICATIONS

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

European Search Report (Application No. 11180109.8) dated Dec. 20, 2011.

Taiwanese Office Action (Application No. 100130104) dated Nov. 26, 2015.

Park.S et al., "Transparent and Photo-stable ZnO Thin-film Transistors to Drive an Active Matrix Organic-Light-Emitting-Diode Display Panel", Adv. Mater. (Advanced Materials), Dec. 4, 2008, vol. 21, No. 6, pp. 678-682.

Korean Office Action (Application No. 2011-0088977) dated Jan. 29, 2018.

* cited by examiner 400  450a  437

450b

453

SEMICONDUCTOR DEVICE

CROSS-REFERENCE TO RELATED APPLICATIONS

This application is a continuation of U.S. application Ser. No. 13/230,093, filed Sep. 12, 2011, now allowed, which claims the benefit of a foreign priority application filed in Japan as Serial No. 2010-204419 on Sep. 13, 2010, both of which are incorporated by reference.

BACKGROUND OF THE INVENTION

1. Field of the Invention

An embodiment of the present invention relates to a semiconductor device including a semiconductor element and a method for driving the semiconductor device.

2. Description of the Related Art

Storage devices including semiconductor elements are broadly classified into two categories: a volatile device that loses stored data when power is not supplied, and a non-volatile device that holds stored data even when power is not supplied.

A typical example of a volatile storage device is a DRAM (dynamic random access memory). A DRAM stores data in such a manner that a transistor included in a storage element is selected and electric charge is stored in a capacitor.

When data is read from a DRAM, electric charge in a capacitor is lost on the above-described principle; thus, another writing operation is necessary whenever data is read out. Moreover, since leakage current (off-state current) flows between a source and a drain of a transistor included in a storage element when the transistor is in an off state for example, electric charge flows into or out even if the transistor is not selected, which makes a data holding period short. For that reason, another writing operation (refresh operation) is necessary at predetermined intervals, and it is difficult to sufficiently reduce power consumption. Furthermore, since stored data is lost when power is not supplied, an additional storage device using a magnetic material or an optical material is needed in order to hold data for a long time.

Another example of a volatile storage device is an SRAM (static random access memory). An SRAM holds stored data by using a circuit such as a flip-flop and thus does not need a refresh operation. This means that an SRAM has an advantage over a DRAM. However, cost per storage capacity is increased because a circuit such as a flip-flop is used. Moreover, as in a DRAM, stored data in an SRAM is lost when power is not supplied.

A typical example of a non-volatile storage device is a flash memory. A flash memory includes a floating gate between a gate electrode and a channel formation region in a transistor and stores data by holding electric charge in the floating gate. Therefore, a flash memory has advantages in that a data holding period is extremely long (almost permanent) and a refresh operation which is necessary in a volatile storage device is not needed (e.g., see Patent Document 1).

However, a gate insulating layer included in a storage element deteriorates by tunneling current generated in writing, so that the storage element stops its function after a predetermined number of writing operations. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary for injection of electric charge into the floating gate or removal of the electric charge, and a circuit for generating high voltage is also necessary. Further, it takes a relatively long time to inject or remove electric charge, and it is not easy to perform writing and erasing at higher speed.

REFERENCE

Patent Document

[Patent Document 1] Japanese Published Patent Application No. S57-105889

SUMMARY OF THE INVENTION

In view of the above problems, an object of an embodiment of the present invention is to provide a semiconductor device with a novel structure in which stored data can be held even when power is not supplied and there is no limitation on the number of writing operations.

In an embodiment of the present invention, a semiconductor device is formed using a material which can sufficiently reduce off-state current of a transistor, e.g., an oxide semiconductor material which is a wide band-gap semiconductor. When a semiconductor material which can sufficiently reduce off-state current of a transistor is used, the semiconductor device can hold data for a long period.

In addition, by providing a capacitor or a noise removal circuit that is electrically connected to a write word line, a signal such as a short pulse or a noise which is different from a control signal that can be input from a driver circuit or the like to a memory cell can be reduced or removed. Accordingly, a malfunction in which data written into a memory cell is erased when a transistor in the memory cell is instantaneously turned on can be prevented.

Specifically, structures described below can be employed, for example.

An embodiment of the present invention is a semiconductor device including a write word line, a read word line, a bit line, a source line, a signal line, a memory cell array including a plurality of memory cells, a first driver circuit, and a second driver circuit. One of the plurality of memory cells includes a first transistor, a second transistor, and a first capacitor. The first transistor includes a first gate electrode, a first source electrode, a first drain electrode, and a first channel formation region. The second transistor includes a second gate electrode, a second source electrode, a second drain electrode, and a second channel formation region. The first channel formation region and the second channel formation region contain semiconductor materials that are different from each other. The first gate electrode, the second drain electrode, and one electrode of the first capacitor are electrically connected to each other to form a node where electric charge is held. The first driver circuit is electrically connected to the first drain electrode included in the memory cell through the bit line, the first source electrode included in the memory cell through the source line, and the second source electrode included in the memory cell through the signal line. The second driver circuit is electrically connected to the other electrode of the first capacitor included in the memory cell through the read word line and the second gate electrode included in the memory cell through the write word line. A second capacitor is provided between the second driver circuit and the memory cell array, and one electrode of the second capacitor is electrically connected to the write word line.

Another embodiment of the present invention is a semiconductor device including a write word line, a read word line, a bit line, a source line, a signal line, a memory cell array including a plurality of memory cells, a first driver circuit, and a second driver circuit. One of the plurality of memory cells includes a first transistor, a second transistor, and a first capacitor. The first transistor includes a first gate electrode, a first source electrode, a first drain electrode, and a first channel formation region. The second transistor includes a second gate electrode, a second source electrode, a second drain electrode, and a second channel formation region. The first channel formation region and the second channel formation region contain semiconductor materials that are different from each other. The first gate electrode, the second drain electrode, and one electrode of the first capacitor are electrically connected to each other to form a node where electric charge is held. The first driver circuit is electrically connected to the first drain electrode included in the memory cell through the bit line, the first source electrode included in the memory cell through the source line, and the second source electrode included in the memory cell through the signal line. The second driver circuit is electrically connected to the other electrode of the first capacitor included in the memory cell through the read word line and the second gate electrode included in the memory cell through the write word line. A second capacitor and a resistor are provided between the second driver circuit and the memory cell array. One electrode of the second capacitor is electrically connected to the write word line and one terminal of the resistor. The other terminal of the resistor is electrically connected to the second driver circuit.

Another embodiment of the present invention is a semiconductor device including a write word line, a read word line, a bit line, a source line, a signal line, a memory cell array including a plurality of memory cells, a first driver circuit, and a second driver circuit. One of the plurality of memory cells includes a first transistor, a second transistor, and a capacitor. The first transistor includes a first gate electrode, a first source electrode, a first drain electrode, and a first channel formation region. The second transistor includes a second gate electrode, a second source electrode, a second drain electrode, and a second channel formation region. The first channel formation region and the second channel formation region contain semiconductor materials that are different from each other. The first gate electrode, the second drain electrode, and one electrode of the capacitor are electrically connected to each other to form a node where electric charge is held. The first driver circuit is electrically connected to the first drain electrode included in the memory cell through the bit line, the first source electrode included in the memory cell through the source line, and the second source electrode included in the memory cell through the signal line. The second driver circuit is electrically connected to the other electrode of the capacitor included in the memory cell through the read word line and the second gate electrode included in the memory cell through the write word line. The second driver circuit includes a noise removal circuit electrically connected to the write word line. The noise removal circuit includes an even number of inverter circuits connected in series and a capacitor.

Another embodiment of the present invention is a semiconductor device including a write word line, a read word line, a bit line, a source line, a signal line, a memory cell array including a plurality of memory cells, a first driver circuit, and a second driver circuit. One of the plurality of memory cells includes a first transistor, a second transistor, and a capacitor. The first transistor includes a first gate electrode, a first source electrode, a first drain electrode, and a first channel formation region. The second transistor includes a second gate electrode, a second source electrode, a second drain electrode, and a second channel formation region. The first channel formation region and the second channel formation region contain semiconductor materials that are different from each other. The first gate electrode, the second drain electrode, and one electrode of the capacitor are electrically connected to each other to form a node where electric charge is held. The first driver circuit is electrically connected to the first drain electrode included in the memory cell through the bit line, the first source electrode included in the memory cell through the source line, and the second source electrode included in the memory cell through the signal line. The second driver circuit is electrically connected to the other electrode of the capacitor included in the memory cell through the read word line and the second gate electrode included in the memory cell through the write word line. The second driver circuit includes a noise removal circuit electrically connected to the write word line. The noise removal circuit includes an even number of inverter circuits connected in series and a resistor.

Another embodiment of the present invention is a semiconductor device including a write word line, a read word line, a bit line, a source line, a signal line, a memory cell array including a plurality of memory cells, a first driver circuit, and a second driver circuit. One of the plurality of memory cells includes a first transistor, a second transistor, and a capacitor. The first transistor includes a first gate electrode, a first source electrode, a first drain electrode, and a first channel formation region. The second transistor includes a second gate electrode, a second source electrode, a second drain electrode, and a second channel formation region. The first channel formation region and the second channel formation region contain semiconductor materials that are different from each other. The first gate electrode, the second drain electrode, and one electrode of the capacitor are electrically connected to each other to form a node where electric charge is held. The first driver circuit is electrically connected to the first drain electrode included in the memory cell through the bit line, the first source electrode included in the memory cell through the source line, and the second source electrode included in the memory cell through the signal line. The second driver circuit is electrically connected to the other electrode of the capacitor included in the memory cell through the read word line and the second gate electrode included in the memory cell through the write word line. The second driver circuit includes a noise removal circuit electrically connected to the write word line. The noise removal circuit includes an even number of inverter circuits connected in series, a capacitor, and a resistor.

In the above structure including the noise removal circuit, the noise removal circuit further includes an AND circuit.

In the above semiconductor device, the second channel formation region of the second transistor contains on oxide semiconductor.

In the above semiconductor device, the first channel formation region of the first transistor contains a material other than an oxide semiconductor.

Note that in the above structure, the transistor includes an oxide semiconductor in some cases; however, the present invention is not limited to this. A material which can realize the off-state current characteristics equivalent to those of the oxide semiconductor, such as a wide-gap material like silicon carbide (specifically, a semiconductor material whose energy gap Eg is larger than 3 eV) may be used.

In addition, in this specification and the like, the term such as "electrode" or "wiring" does not limit a function of such a component. For example, an "electrode" is sometimes used as part of a "wiring", and vice versa. Furthermore, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object.

Examples of an object having any electric function are a switching element such as a transistor, a resistor, an inductor, a capacitor, and an element with a variety of functions as well as an electrode and a wiring.

Since the off-state current of a transistor including an oxide semiconductor is extremely small, stored data can be held for an extremely long time by using the transistor. In other words, power consumption can be adequately reduced because a refresh operation becomes unnecessary or the frequency of refresh operations can be extremely low. Moreover, stored data can be held for a long period even when power is not supplied (note that the potential is preferably fixed).

Further, a semiconductor device according to an embodiment of the present invention does not need high voltage for writing of data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to an embodiment of the present invention has no limitation on the number of times of rewriting operations, which is a problem in a conventional non-volatile memory, and thus has significantly improved reliability. Furthermore, data is written depending on the on state and the off state of the transistor, whereby high-speed operation can be easily realized. In addition, there is no need of operation for erasing data.

In addition, in a semiconductor device according to an embodiment of the present invention, by providing a capacitor or a noise removal circuit that is electrically connected to a write word line, a signal such as a short pulse or a noise which is different from a control signal that can be input from a driver circuit or the like to a memory cell can be reduced or removed. Accordingly, a malfunction in which data written into the memory cell is erased when a transistor in the memory cell is instantaneously turned on can be prevented.

Since a transistor including a material other than an oxide semiconductor can operate at sufficiently high speed, a semiconductor device can perform operation (e.g., reading of data) at sufficiently high speed using the transistor in combination with a transistor including an oxide semiconductor. Further, a transistor including a material other than an oxide semiconductor can favorably realize a variety of circuits (such as a logic circuit or a driver circuit) which are required to operate at high speed.

As described above, a semiconductor device having a novel feature can be realized by being provided with both the transistor including a material other than an oxide semiconductor (in other words, a transistor capable of operating at sufficiently high speed) and the transistor including an oxide semiconductor (in other words, a transistor whose off-state current is sufficiently small).

DETAILED DESCRIPTION OF THE INVENTION

Figures 1, 1A:
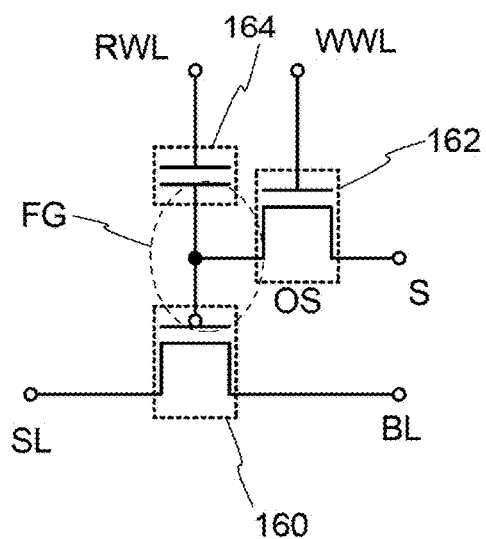
FIGS. 1A-1, 1A-2, and 1B are each a circuit diagram of a semiconductor device.

Hereinafter, examples of embodiments of the present invention will be described with reference to the drawings. Note that the present invention is not limited to the following description and it will be readily appreciated by those skilled in the art that modes and details thereof can be modified in various ways without departing from the spirit and the scope of the present invention. Therefore, the present invention should not be construed as being limited to the description in the following embodiments.

Note that the position, the size, the range, or the like of each structure illustrated in drawings and the like is not accurately represented in some cases for easy understanding. For this reason, the present invention is not necessarily limited to the position, the size, the range, or the like as disclosed in the drawings and the like.

In this specification and the like, ordinal numbers such as "first", "second", and "third" are used in order to avoid confusion among components, and the terms do not mean limitation of the number of components.

Embodiment 1

In this embodiment, a circuit structure and operation of a semiconductor device according to an embodiment of the disclosed invention will be described with reference to FIGS. 1A-1 to 1B and FIGS. 2A to 2C. Note that in each of the circuit diagrams, in some cases, "OS" is written beside a transistor in order to indicate that the transistor includes an oxide semiconductor.

<Basic Circuit>

First, the most basic circuit structure of a memory cell and its operation will be described with reference to FIGS. 1A-1 to 1B. In a semiconductor device including a memory cell illustrated in FIG. 1A-1, a bit line BL and a source electrode (or a drain electrode) of a transistor 160 are electrically connected to each other, and a source line SL and the drain electrode (or the source electrode) of the transistor 160 are electrically connected to each other. In addition, a signal line S and a source electrode (or a drain electrode) of a transistor 162 are electrically connected to each other, and a write word line WWL and a gate electrode of the transistor 162 are electrically connected to each other. A gate electrode of the transistor 160 and the drain electrode (or the source electrode) of the transistor 162 are electrically connected to one electrode of a capacitor 164. A read word line RWL and the other electrode of the capacitor 164 are electrically connected to each other.

Here, a transistor including an oxide semiconductor is used as the transistor 162, for example. A transistor including an oxide semiconductor has a characteristic of a significantly small off-state current. For that reason, the potential of the gate electrode of the transistor 160 can be held for an extremely long time by turning off the transistor 162. Provision of the capacitor 164 facilitates holding of electric charge supplied to the gate electrode of the transistor 160 and reading of held data.

Note that there is no particular limitation on a material of the transistor 160. In terms of increasing the speed of reading data, it is preferable to use, for example, a transistor with a high switching rate such as a transistor formed using single crystal silicon.

Figure 1B:
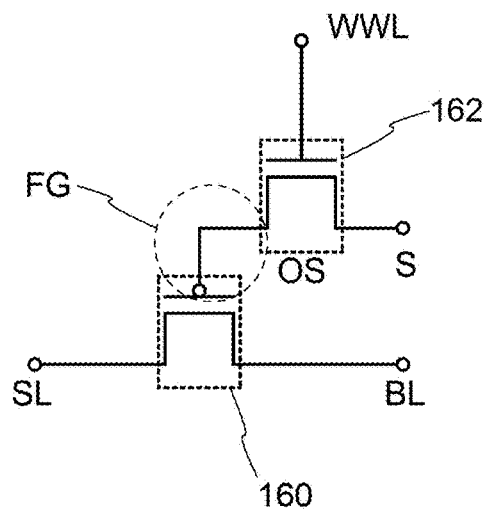

Alternatively, the capacitor 164 may be omitted as illustrated in FIG. 1B.

The semiconductor device illustrated in FIG. 1A-1 utilizes a characteristic in which the potential of the gate electrode of the transistor 160 can be held, thereby writing, holding, and reading data as follows.

First, writing and holding of data will be described. The potential of the write word line WWL is set to a potential which allows the transistor 162 to be turned on, so that the transistor 162 is turned on. Accordingly, the potential of the signal line S is supplied to the gate electrode of the transistor 160 and the capacitor 164. That is, a predetermined amount of electric charge is supplied to the gate electrode of the transistor 160 (writing). Here, one of electric charges for supplying two different potentials (hereinafter, electric charge for supplying a low potential is referred to as electric charge $Q_L$ and electric charge for supplying a high potential is referred to as electric charge $Q_H$) is supplied to the gate electrode of the transistor 160. Note that electric charges for supplying three or more different potentials may be applied to improve storage capacity. After that, the potential of the write word line WWL is set to a potential which allows the transistor 162 to be turned off, so that the transistor 162 is turned off. Thus, the electric charge supplied to the gate electrode of the transistor 160 is held (holding).

Since the off-state current of the transistor 162 is significantly small, the electric charge of the gate electrode of the transistor 160 is held for a long time.

Next, reading of data will be described. By supplying an appropriate potential (reading potential) to the read word line RWL while a predetermined potential (constant potential) is supplied to the source line SL, the potential of the bit line BL varies depending on the amount of electric charge held in the gate electrode of the transistor 160. In other words, the conductance of the transistor 160 is controlled by the electric charge held in the gate electrode of the transistor 160.

In general, when the transistor 160 is a p-channel transistor, an apparent threshold voltage $V_{th\_H}$ in the case where $Q_H$ is supplied to the gate electrode of the transistor 160 is lower than an apparent threshold voltage $V_{th\_L}$ in the case where $Q_L$ is supplied to the gate electrode of the transistor 160.

For example, in the case where $Q_L$ is supplied in writing, when the potential of the read word line RWL is $V_0$ (a potential intermediate between $V_{th\_H}$ and $V_{th\_L}$), the transistor 160 is turned on. In the case where $Q_H$ is supplied in writing, even when the potential of the read word line RWL is $V_0$, the transistor 160 remains off. Thus, data held can be read with the potential of the bit line BL.

Note that in the case where memory cells are arrayed to be used, only data of desired memory cells is needed to be read. Thus, in the case where data of predetermined memory cells is read and data of the other memory cells is not read, a potential which allows the transistor 160 to be turned off regardless of a state of the gate electrode, that is, a potential higher than $V_{th\_L}$ may be supplied to the read word lines RWL of the memory cells whose data is not to be read. Alternatively, a potential which allows the transistor 160 to be turned on regardless of the state of the gate electrode, that is, a potential lower than $V_{th\_H}$, may be supplied to the read word lines RWL of the memory cells whose data is not to be read.

Then, rewriting of data will be described. Rewriting of data is performed in a manner similar to that of the writing and holding of data. In other words, the potential of the write word line WWL is set to a potential which allows the transistor 162 to be turned on, so that the transistor 162 is turned on. Accordingly, the potential of the signal line S (a potential for new data) is supplied to the gate electrode of the transistor 160 and the capacitor 164. After that, the potential of the write word line WWL is set to a potential which allows the transistor 162 to be turned off, so that the transistor 162 is turned off. Thus, the electric charge for new data is held in the gate electrode of the transistor 160.

Although the above description has been made with the transistor 160 as a p-channel transistor, the transistor 160 may be an n-channel transistor. In that case, a potential supplied to each wiring may be adjusted to be an appropriate potential.

In the semiconductor device according to an embodiment of the disclosed invention, data can be directly rewritten by another writing of data as described above. Therefore, extracting of electric charge from a floating gate with the use of high voltage needed in a flash memory or the like is not necessary, and thus, reduction in operation speed, which is attributed to an erasing operation, can be suppressed. In other words, a high-speed operation of the semiconductor device can be realized.

Note that the drain electrode (or the source electrode) of the transistor 162 is electrically connected to the gate electrode of the transistor 160 and thereby there is an effect similar to that of a floating gate of a floating gate transistor which is used as a non-volatile memory element. Hereinafter, a portion where the drain electrode (or the source electrode) of the transistor 162 and the gate electrode of the transistor 160 are electrically connected to each other is called a node FG in some cases. When the transistor 162 is off, the node FG can be regarded as being embedded in an insulator and electric charge is held in the node FG. The off-state current of the transistor 162 including an oxide semiconductor is less than or equal to one hundred thousandth of the off-state current of a transistor including a silicon semiconductor or the like; thus, loss of the electric charge stored in the node FG due to leakage current of the transistor 162 is negligible. That is, with the transistor 162 including an oxide semiconductor, a non-volatile storage device which can hold data without being supplied with power can be realized.

For example, when the off-state current of the transistor 162 is less than or equal to 10 zA (1 zA (zeptoampere) is $1 \times 10^{-21}$ A) at room temperature (25° C.) and the capacitance value of the capacitor 164 is approximately 10 fF, data can be held for at least greater than or equal to $10^4$ seconds. It is needless to say that the holding time depends on transistor characteristics and the capacitance value.

In the semiconductor device according to an embodiment of the disclosed invention, a problem of deterioration of a gate insulating film (a tunnel insulating film), which occurs in a conventional floating gate transistor, does not exist. That is, the deterioration of a gate insulating film due to injection of electrons into a floating gate, which has been traditionally regarded as a problem, can be solved. This means that there is no limitation on the number of times of writing operations in principle. Furthermore, high voltage needed for writing or erasing of data in a conventional floating gate transistor is not necessary.

Figures 1, 1A, 2:
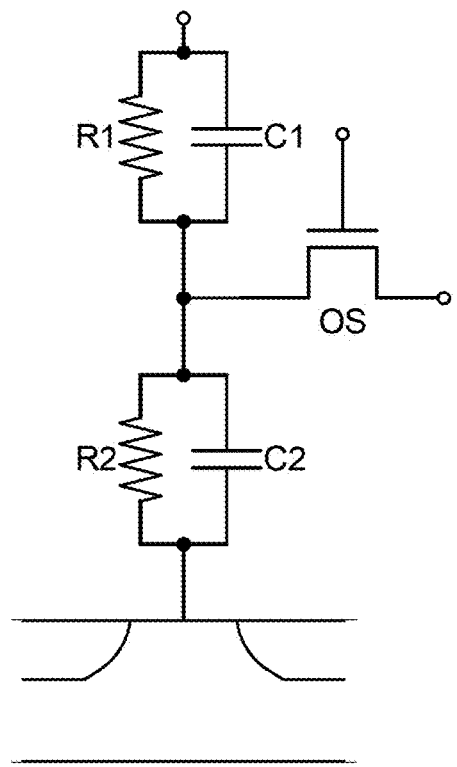

The components such as transistors in the semiconductor device in FIG. 1A-1 can each be regarded as including a resistor and a capacitor as illustrated in FIG. 1A-2. That is, in FIG. 1A-2, the transistor 160 and the capacitor 164 are each regarded as including a resistor and a capacitor. R1 and C1 denote the resistance value and the capacitance value of the capacitor 164, respectively. The resistance value R1 corresponds to the resistance value which depends on an insulating layer included in the capacitor 164. R2 and C2 denote the resistance value and the capacitance value of the transistor 160, respectively. The resistance value R2 corresponds to the resistance value which depends on a gate insulating layer at the time when the transistor 160 is on. The capacitance C2 corresponds to the capacitance value of so-called gate capacitance (capacitance formed between the gate electrode and the source electrode or the drain electrode and capacitance formed between the gate electrode and the channel formation region).

An electric charge holding period (also referred to as a data holding period) is determined mainly by the off-state current of the transistor 162 under the conditions where the gate leakage current of the transistor 162 is sufficiently small and R1 and R2 satisfy R1≥ROS and R2≥ROS, where ROS is the resistance value (also referred to as an effective resistance value) between the source electrode and the drain electrode in a state where the transistor 162 is off.

On the other hand, when the conditions are not met, it is difficult to sufficiently secure the holding period even if the off-state current of the transistor 162 is sufficiently small. This is because a leakage current other than the off-state current of the transistor 162 (e.g., a leakage current generated between the source electrode and the gate electrode of the transistor 160) is large. Accordingly, it can be said that it is preferable that the semiconductor device disclosed in this embodiment satisfy the above relations of R1≥ROS and R2≥ROS.

It is desirable that C1 and C2 satisfy C1≥C2. This is because if C1 is large, when the potential of the node FG is controlled by the read word line RWL, the potential of the read word line RWL can be efficiently supplied to the node FG and the difference between potentials supplied to the read word line RWL (e.g., a potential for reading and a potential for non-reading) can be kept small.

As described above, when the above relation is satisfied, a more favorable semiconductor device can be realized. Note that R1 and R2 are controlled by the gate insulating layer of the transistor 160 and the insulating layer of the capacitor 164. The same relation is applied to C1 and C2. Therefore, the material, the thickness, and the like of the gate insulating layer of the transistor 160 and the insulating layer of the capacitor 164 are desirably set as appropriate to satisfy the above relation.

In the semiconductor device described in this embodiment, the node FG has an effect similar to that of a floating gate of a floating gate transistor in a flash memory or the like, but the node FG of this embodiment has a feature which is essentially different from that of the floating gate in the flash memory or the like.

In a flash memory, since a potential applied to a control gate is high, it is necessary to keep a proper distance between cells in order to prevent the potential from affecting a floating gate of the adjacent cell. This is one of inhibiting factors for higher integration of the semiconductor device. The factor is attributed to a basic principle of a flash memory, in which a tunneling current flows by applying a high electric field.

In contrast, the semiconductor device according to this embodiment is operated by switching of a transistor including an oxide semiconductor and does not use the above-described principle of electric charge injection by tunneling current. That is, a high electric field for electric charge injection is not necessary unlike a flash memory. Accordingly, it is not necessary to consider an influence of a high electric field from a control gate on the adjacent cell, which facilitates higher integration.

In addition, it is also advantageous that a high electric field is unnecessary and a large peripheral circuit (such as a step-up circuit) is unnecessary as compared to a flash memory. For example, the highest voltage applied to the memory cell according to this embodiment (the difference between the highest potential and the lowest potential applied to terminals of the memory cell at the same time) can be lower than or equal to 5 V, preferably lower than or equal to 3 V in each memory cell in the case where two levels (one bit) of data is written.

In the case where the relative dielectric constant εr1 of the insulating layer included in the capacitor 164 is made different from the relative dielectric constant εr2 of the insulating layer included in the transistor 160, C1 can easily be made greater than or equal to C2 (C1≥C2) while S1 which is the area of the insulating layer included in the capacitor 164 and S2 which is the area of the insulating layer forming gate capacitance of the transistor 160 satisfy the relation where 2·S2 is greater than or equal to S1 (2~S2≥S1), desirably S2 is greater than or equal to S1 (S2≥S1). In other words, C1 can easily be made greater than or equal to C2

(C1≥C2) while the area of the insulating layer included in the capacitor 164 is made small. Specifically, for example, a film including a high-k material such as hafnium oxide or a stack of a film including a high-k material such as hafnium oxide and a film including an oxide semiconductor is used for the insulating layer included in the capacitor 164 so that εr1 can be greater than or equal to 10, preferably greater than or equal to 15; silicon oxide is used for the insulating layer forming the gate capacitance of the transistor 160 so that εr2 can be 3 to 4.

Combination of such structures enables higher integration of the semiconductor device according to an embodiment of the disclosed invention.

Note that in addition to the increase in the degree of integration, a multilevel technique can be employed in order to increase the storage capacity of the semiconductor device. For example, three or more levels of data are written to one memory cell, whereby the storage capacity can be increased as compared to that in the case where two-level (one-bit) data is written. The multilevel technique can be achieved by, for example, supplying electric charge Q for supplying another level of a potential to the gate electrode of the transistor 160, in addition to the electric charge $Q_L$ for supplying a low potential and the electric charge $Q_H$ for supplying a high potential. In this case, enough storage capacity can be ensured even in a circuit structure with a relatively large scale (e.g., 15 $F^2$ to 50 $F^2$; F is the minimum feature size).

Application Example

Next, a more specific circuit structure to which the circuit of the memory cell illustrated in FIGS. 1A-1 to 1B is applied and an operation thereof will be described with reference to FIGS. 2A to 2C.

Figure 2A:
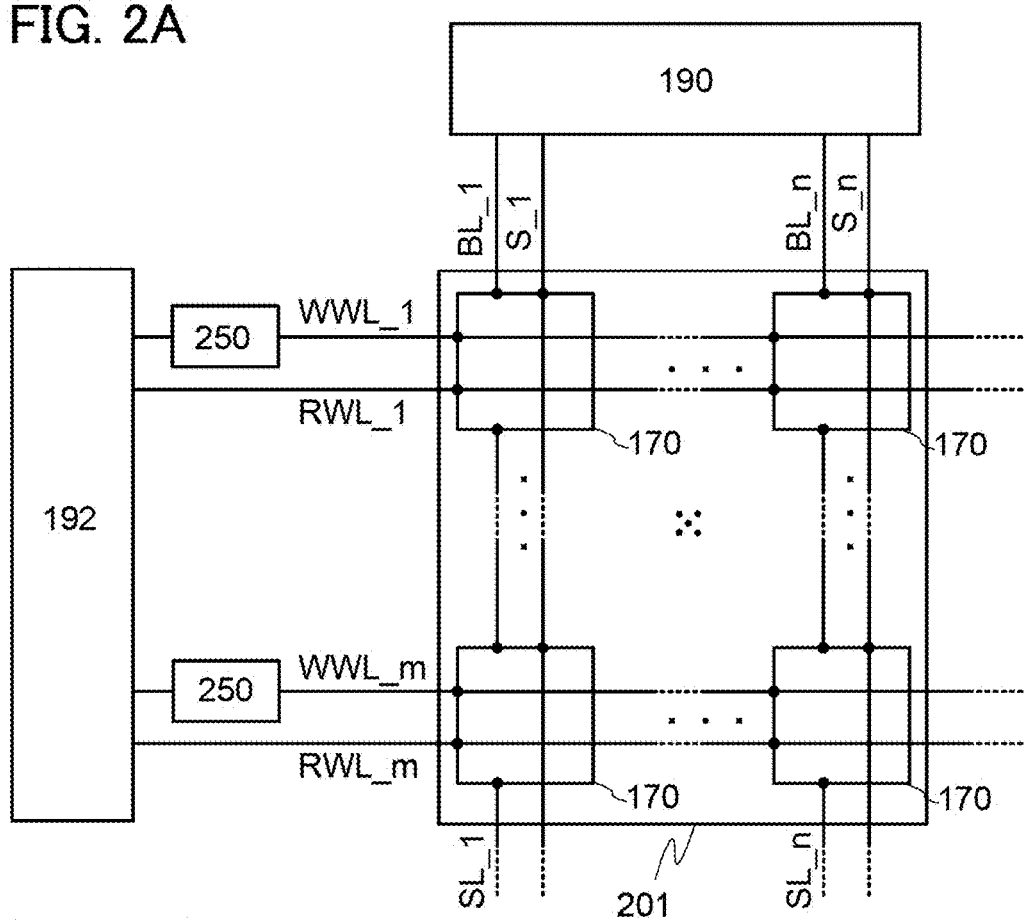
FIGS. 2A to 2C are each a block diagram of a semiconductor device.

FIG. 2A is an example of a circuit diagram of a semiconductor device including (m×n) memory cells 170. The structure of the memory cells 170 in FIG. 2A is similar to that in FIG. 1A-1. Note that in FIG. 2A, only the memory cells 170 in the first row are directly connected to the bit lines BL, and only the memory cells 170 in the m-th row are directly connected to the source lines SL. The memory cells 170 in other rows are electrically connected to the bit lines BL and the source lines SL through other memory cells 170 in the same columns.

The semiconductor device in FIG. 2A includes m (m is an integer of greater than or equal to 2) write word lines WWL, m read word lines RWL, n (n is an integer of greater than or equal to 2) source lines SL, n bit lines BL, n signal lines S, a memory cell array 201 including the memory cells 170 arranged in a matrix of m (rows)×n (columns), a first driver circuit 190 connected to the n bit lines BL and the n signal lines S, and a second driver circuit 192 connected to the m write word lines WWL and the m read word lines RWL.

The semiconductor device illustrated in FIG. 2A includes a capacitor 250 between the second driver circuit 192 and the memory cell array 201. An example of the capacitor 250 is illustrated in FIG. 2B. As illustrated in FIG. 2B, one electrode of the capacitor 250 is electrically connected to the write word line WWL.

Alternatively, the semiconductor device illustrated in FIG. 2A may include the capacitor 250 and a resistor 251 (not illustrated in FIG. 2A) between the second driver circuit 192 and the memory cell array 201. For example, the capacitor 250 and the resistor 251 illustrated in FIG. 2C can be used. As illustrated in FIG. 2C, one electrode of the capacitor 250 is electrically connected to the write word line WWL and one terminal of the resistor 251. The other terminal of the resistor 251 is electrically connected to the second driver circuit 192.

Note that it is not necessary to provide the capacitor 250 or the capacitor 250 and the resistor 251 on the read word line RWL side. Alternatively, the capacitor 250 or the capacitor 250 and the resistor 251 may be provided on the read word line RWL side in a manner similar to that on the write word line WWL side.

Writing, holding, and reading of data are basically similar to the case of FIGS. 1A-1 to 1B. That is, a specific writing operation is as described below. Note that although the case where either a potential V1 (a potential lower than a power supply potential VDD) or a reference potential GND is supplied to the node FG is described here as an example, the relation among potentials supplied to the node FG is not limited to this example. Data that is held when the potential V1 is supplied to the node FG is data "1", and data that is held when the reference potential GND is supplied to the node FG is data "0". The potential of the source line SL is set to VDD or a potential (VR) which is lower than VDD to some extent. Note that the potential of the source line SL may be temporarily changed unless the operation is interfered with.

First, the memory cell 170 is selected by setting the potentials of the read word line RWL and the write word line WWL, which are connected to the memory cell 170, to GND and V2 (a potential higher than V1, such as VDD), respectively.

In the case of writing data "0" to the memory cell 170, GND is supplied to the signal line S, and in the case of writing data "1" to the memory cell 170, V1 is supplied to the signal line S. Because the potential of the write word line WWL is V2 here, V1 can be supplied to the node FG.

Data is held by setting the potential of the read word line RWL and the potential of the write word line WWL to GND.

When the potential of the read word line RWL is fixed to GND, the potential of the node FG is fixed to the potential at the time of writing. In other words, when V1 for data "1" is supplied to the node FG, the potential of the node FG is V1, and when GND for data "0" is supplied to the node FG, the potential of the node FG is GND.

Because GND is supplied to the write word line WWL, the transistor 162 is turned off regardless of whether data "1" or data "0" is written. Since the off-state current of the transistor 162 is significantly small, the electric charge of the gate electrode of the transistor 160 is held for a long time.

Data is read by setting the potentials of the read word line RWL and the write word line WWL, which are connected to the memory cell 170 that is a target for reading, to GND and by setting the potentials of the read word lines RWL and the write word lines WWL, which are connected to the memory cells 170 that are not the target for reading, to V1 and GND, respectively.

When the potential of the read word line RWL connected to the memory cell 170 that is the target for reading is set to GND, the transistor 160 is turned off if V1 for data "1" is supplied to the node FG of the memory cell 170 that is the target for reading. On the other hand, the transistor 160 is turned on if GND for data "0" is supplied to the node FG.

When the potentials of the read word lines RWL and the write word lines WWL, which are connected to the memory cells 170 that are not the target for reading, are set to V1 and GND, respectively, the transistors 160 are turned off regardless of whether data "1" or data "0" is written to the memory cells 170 that are not the target for reading.

That is, in accordance with the above reading operation, in the case where data "1" is written to the memory cell 170 that is the target for reading, the transistor 160 is turned off and the potential of the bit line BL is kept at the level of the beginning of the reading operation or decreased; whereas in the case where data "0" is written to the memory cell 170, the transistor 160 is turned on and the potential of the bit line BL is increased.

Although the above description has been made with the transistor 160 as a p-channel transistor, the transistor 160 may be an n-channel transistor. In that case, a potential supplied to each wiring may be adjusted to be an appropriate potential.

As described above, the semiconductor device according to an embodiment of the disclosed invention is operated by switching of the transistor 162 and holds electric charge in the node FG for a long time by utilizing a significantly small off-state current of the transistor 162. Therefore, when a signal such as a short pulse or a noise which is different from a control signal is input to the write word line WWL electrically connected to the gate electrode of the transistor 162 and the transistor 162 is instantaneously turned on, data written into the memory cell 170 might be erased.

In the semiconductor device according to an embodiment of the disclosed invention, by providing the capacitor 250 or the capacitor 250 and the resistor 251 that are electrically connected to the write word line WWL between the second driver circuit 192 and the memory cell array 201, a signal such as a short pulse or a noise which is different from a control signal can be reduced or removed. Accordingly, a malfunction in which data written into the memory cell 170 is erased when the transistor 162 in the memory cell 170 is instantaneously turned on can be prevented.

The signal such as a short pulse or a noise which is different from a control signal includes a signal input from the second driver circuit 192 as well as a signal due to a potential change in the case where the potential is unstable when supply of power is started and when supply of power is stopped, and the like.

As described above, by providing the capacitor 250 or the capacitor 250 and the resistor 251 that are electrically connected to the write word line WWL between the second driver circuit 192 and the memory cell array 201, a signal such as a short pulse or a noise which is different from a control signal can be reduced or removed. Accordingly, a malfunction in which data written into the memory cell 170 is erased when the transistor 162 in the memory cell 170 is instantaneously turned on can be prevented.

The structures, methods, and the like described in this embodiment can be combined as appropriate with any of the structures, methods, and the like described in the other embodiments.

Embodiment 2

In this embodiment, a circuit structure to which the circuit of the memory cell illustrated in FIGS. 1A-1 to 1B is applied and which is different from that in FIGS. 2A to 2C will be described with reference to FIGS. 3A to 3D and FIGS. 4A to 4F.

Figure 3A:
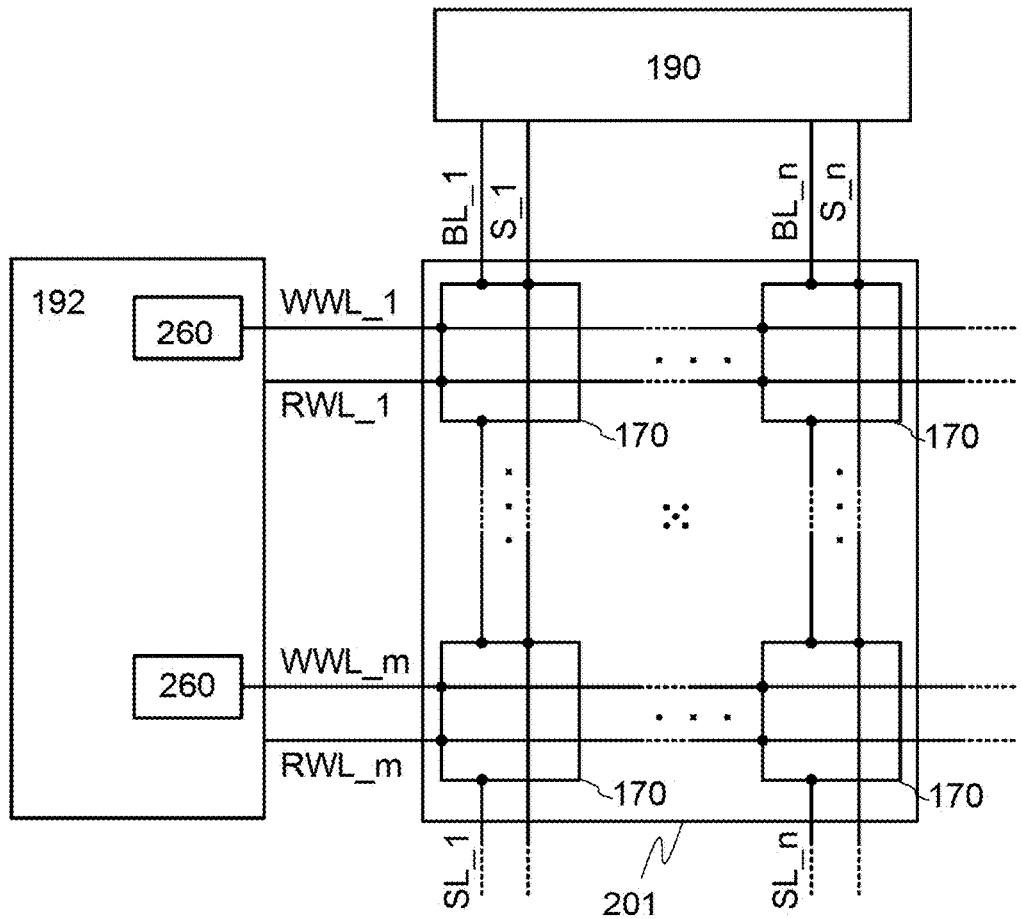
FIGS. 3A to 3D are each a block diagram of a semiconductor device.

FIG. 3A is an example of a circuit diagram of a semiconductor device including (m×n) memory cells 170. The structure of the memory cells 170 in FIG. 3A is similar to that in FIG. 1A-1 and FIG. 2A; therefore, the detailed description thereof is omitted.

The semiconductor device in FIG. 3A includes a memory cell array 201 including the memory cells 170 arranged in a matrix of m (rows)×n (columns), a first driver circuit 190 connected to n bit lines BL and n signal lines S, and a second driver circuit 192 connected to m write word lines WWL and m read word lines RWL.

In the semiconductor device illustrated in FIG. 3A, the second driver circuit 192 includes a noise removal circuit 260 that is electrically connected to the write word line WWL. For example, the noise removal circuit 260 illustrated in FIG. 3B can be used. The noise removal circuit 260 illustrated in FIG. 3B includes an even number of inverter circuits connected in series and a capacitor. For example, the noise removal circuit 260 includes a first inverter circuit, a second inverter circuit, and a capacitor. One electrode of the capacitor is electrically connected to an output terminal of the first inverter circuit and an input terminal of the second inverter circuit. Although a structure in which two inverter circuits are used is illustrated in the drawing, the number of the inverter circuits is not limited thereto as long as an even number of inverter circuits are used. In that case, at least one inverter circuit may be provided on either side of the capacitor.

Figure 3B:
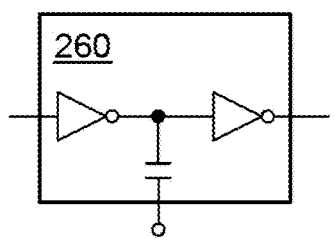
Figure 3D:
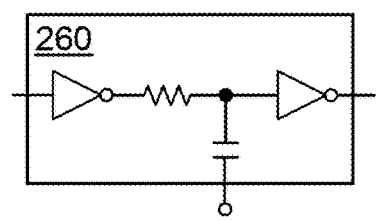
Figure 3C:
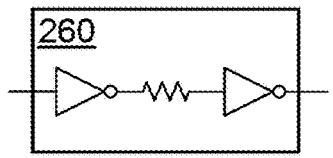

Alternatively, the noise removal circuit 260 illustrated in FIG. 3C may be used in the semiconductor device illustrated in FIG. 3A. The noise removal circuit 260 illustrated in FIG. 3C includes an even number of inverter circuits connected in series and a resistor. For example, the noise removal circuit 260 includes a first inverter circuit, a second inverter circuit, and a resistor. One terminal of the resistor is electrically connected to an output terminal of the first inverter circuit, and the other terminal of the resistor is electrically connected to an input terminal of the second inverter circuit. Although a structure in which two inverter circuits are used is illustrated in the drawing, the number of the inverter circuits is not limited thereto as long as an even number of inverter circuits are used. In that case, at least one inverter circuit may be provided on either side of the resistor.

Alternatively, the noise removal circuit 260 illustrated in FIG. 3D may be used in the semiconductor device illustrated in FIG. 3A. The noise removal circuit 260 illustrated in FIG. 3D includes an even number of inverter circuits connected in series, a capacitor, and a resistor. For example, the noise removal circuit 260 includes a first inverter circuit, a second inverter circuit, a capacitor, and a resistor. One terminal of the resistor is electrically connected to an output terminal of the first inverter circuit, and the other terminal of the resistor and one electrode of the capacitor are electrically connected to an input terminal of the second inverter circuit. Although a structure in which two inverter circuits are used is illustrated in the drawing, the number of the inverter circuits is not limited thereto as long as an even number of inverter circuits are used. In that case, at least one inverter circuit may be provided on either side of a set of the capacitor and the resistor.

Figure 4A:
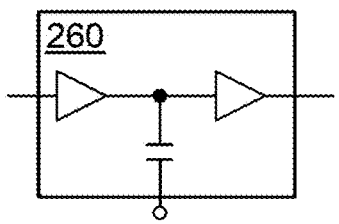
FIGS. 4A to 4F are each a circuit diagram of a semiconductor device.

Alternatively, the noise removal circuit 260 illustrated in FIG. 4A may be used in the semiconductor device illustrated in FIG. 3A. The noise removal circuit 260 illustrated in FIG. 4A includes two buffer circuits connected in series and a capacitor. For example, the noise removal circuit 260 includes a first buffer circuit, a second buffer circuit, and a capacitor. One electrode of the capacitor is electrically connected to an output terminal of the first buffer circuit and an input terminal of the second buffer circuit. Although a structure in which two buffer circuits are used is illustrated in the drawing, the number of the buffer circuits is not limited thereto as long as a plurality of buffer circuits are used. In that case, at least one buffer circuit may be provided on either side of the capacitor.

Figure 4F:
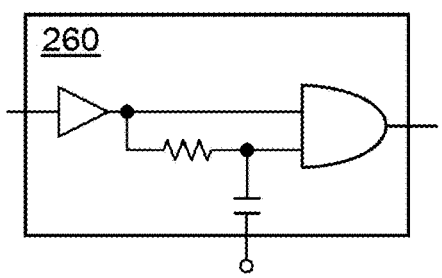
Figure 4B:
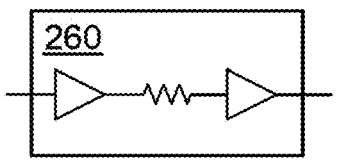

Alternatively, the noise removal circuit 260 illustrated in FIG. 4B may be used in the semiconductor device illustrated in FIG. 3A. The noise removal circuit 260 illustrated in FIG. 4B includes a plurality of buffer circuits connected in series and a resistor. For example, the noise removal circuit 260 includes a first buffer circuit, a second buffer circuit, and a resistor. One terminal of the resistor is electrically connected to an output terminal of the first buffer circuit, and the other terminal of the resistor is electrically connected to an input terminal of the second buffer circuit. Although a structure in which two buffer circuits are used is illustrated in the drawing, the number of the buffer circuits is not limited thereto as long as a plurality of buffer circuits are used. In that case, at least one buffer circuit may be provided on either side of the resistor.

Figure 4C:
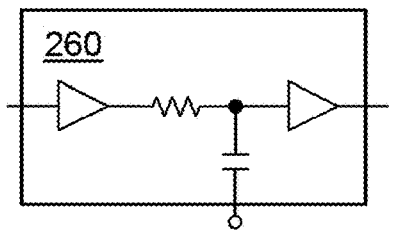

Alternatively, the noise removal circuit 260 illustrated in FIG. 4C may be used in the semiconductor device illustrated in FIG. 3A. The noise removal circuit 260 illustrated in FIG. 4C includes a plurality of buffer circuits connected in series, a capacitor, and a resistor. For example, the noise removal circuit 260 includes a first buffer circuit, a second buffer circuit, a capacitor, and a resistor. One terminal of the resistor is electrically connected to an output terminal of the first buffer circuit, and the other terminal of the resistor and one electrode of the capacitor are electrically connected to an input terminal of the second buffer circuit. Although a structure in which two buffer circuits are used is illustrated in the drawing, the number of the buffer circuits is not limited thereto as long as a plurality of buffer circuits are used. In that case, at least one buffer circuit may be provided on either side of a set of the capacitor and the resistor.

Figure 4D:
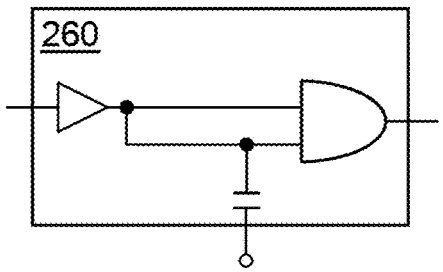

Alternatively, the noise removal circuit 260 illustrated in FIG. 4D may be used in the semiconductor device illustrated in FIG. 3A. The noise removal circuit 260 illustrated in FIG. 4D includes a buffer circuit, a capacitor, and an AND circuit. An output terminal of the buffer circuit is electrically connected to both input terminals of the AND circuit and one electrode of the capacitor. Although a structure in which one buffer circuit is used is illustrated in the drawing, a plurality of buffer circuits may be used.

Figure 4E:
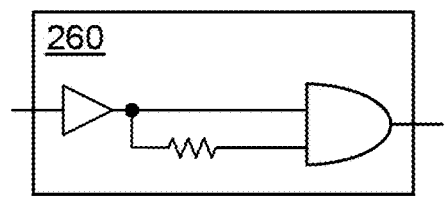

Alternatively, the noise removal circuit 260 illustrated in FIG. 4E may be used in the semiconductor device illustrated in FIG. 3A. The noise removal circuit 260 illustrated in FIG. 4E includes a buffer circuit, a resistor, and an AND circuit. An output terminal of the buffer circuit is electrically connected to one input terminal of the AND circuit and one terminal of the resistor. The other terminal of the resistor is electrically connected to the other input terminal of the AND circuit. Although a structure in which one buffer circuit is used is illustrated in the drawing, a plurality of buffer circuits may be used.

Alternatively, the noise removal circuit 260 illustrated in FIG. 4F may be used in the semiconductor device illustrated in FIG. 3A. The noise removal circuit 260 illustrated in FIG. 4F includes a buffer circuit, a capacitor, a resistor, and an AND circuit. An output terminal of the buffer circuit is electrically connected to one input terminal of the AND circuit and one terminal of the resistor. The other terminal of the resistor is electrically connected to one electrode of the capacitor and the other input terminal of the AND circuit. Although a structure in which one buffer circuit is used is illustrated in the drawing, a plurality of buffer circuits may be used.

In the above structure, the buffer circuit may be formed by using an even number of inverter circuits.

It is not necessary to provide the noise removal circuit 260 on the read word line RWL side. Alternatively, the noise removal circuit 260 may be provided on the read word line RWL side in a manner similar to that on the write word line WWL side.

Writing, holding, and reading of data are basically similar to those in the case of FIGS. 1A-1 to 1B and FIGS. 2A to 2C.

As described above, the semiconductor device according to an embodiment of the disclosed invention is operated by switching of the transistor 162 and holds electric charge in the node FG for a long time by utilizing a significantly small off-state current of the transistor 162. Therefore, when a signal such as a short pulse or a noise which is different from a control signal is input to the write word line WWL electrically connected to the gate electrode of the transistor 162 and the transistor 162 is instantaneously turned on, data written into the memory cell 170 might be erased.

In the semiconductor device according to an embodiment of the disclosed invention, by providing the noise removal circuit 260 that is electrically connected to the write word line WWL, a signal such as a short pulse or a noise which is different from a control signal can be reduced or removed. Accordingly, a malfunction in which data written into the memory cell 170 is erased when the transistor 162 in the memory cell 170 is instantaneously turned on can be prevented.

An inverter circuit in which a data inversion threshold level is changed may be used as each of the inverter circuits illustrated in FIGS. 3B to 3D and the inverter circuits included in the buffer circuits illustrated in FIGS. 4A to 4F. The data inversion threshold level in the inverter circuit can be changed in such a manner that, for example, the size (the channel length and/or the channel width) of a p-channel transistor used in the inverter circuit or the size (the channel length and/or the channel width) of an n-channel transistor used in the inverter circuit is changed. Alternatively, the data inversion threshold level in the inverter circuit may be changed by using a circuit having hysteresis characteristics (a hysteresis type inverter circuit or a hysteresis type AND circuit). By changing the data inversion threshold level, the effect of reducing or removing a signal such as a short pulse or a noise which is different from a control signal can be improved.

As described above, by providing the noise removal circuit 260 that is electrically connected to the write word line WWL, a signal such as a short pulse or a noise which is different from a control signal can be reduced or removed. Accordingly, a malfunction in which data written into the memory cell 170 is erased when the transistor 162 in the memory cell 170 is instantaneously turned on can be prevented.

The structures, methods, and the like described in this embodiment can be combined as appropriate with any of the structures, methods, and the like described in the other embodiments.

Embodiment 3

In this embodiment, application examples of a semiconductor device according to an embodiment of the disclosed invention will be described with reference to FIGS. 5A to 5C. Here, the structure of part of a memory cell array or an entire memory cell array included in a semiconductor device will be described. Note that in each of the circuit diagrams, in some cases, "OS" is written beside a transistor in order to indicate that the transistor includes an oxide semiconductor.

Figure 5A:
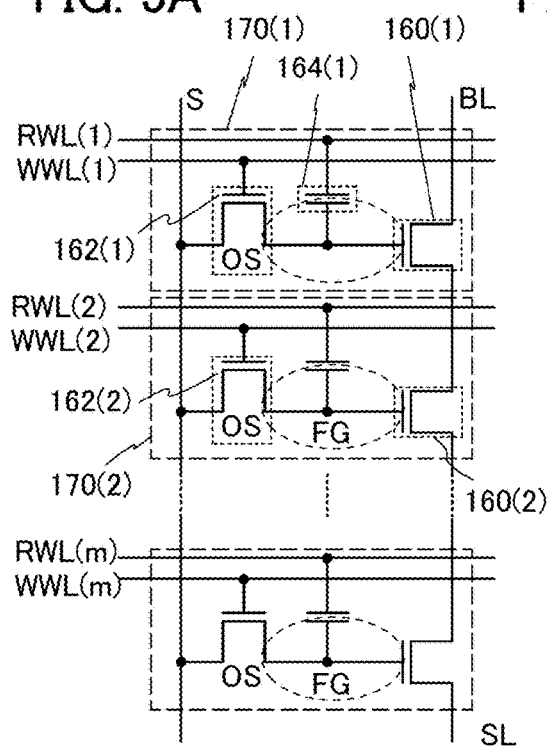
FIGS. 5A to 5C are each a circuit diagram of a semiconductor device.
Figure 5B:
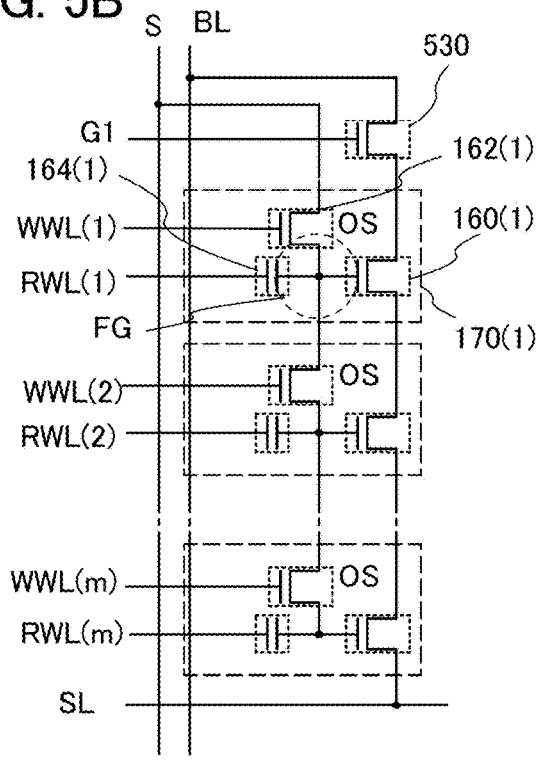
Figure 5C:
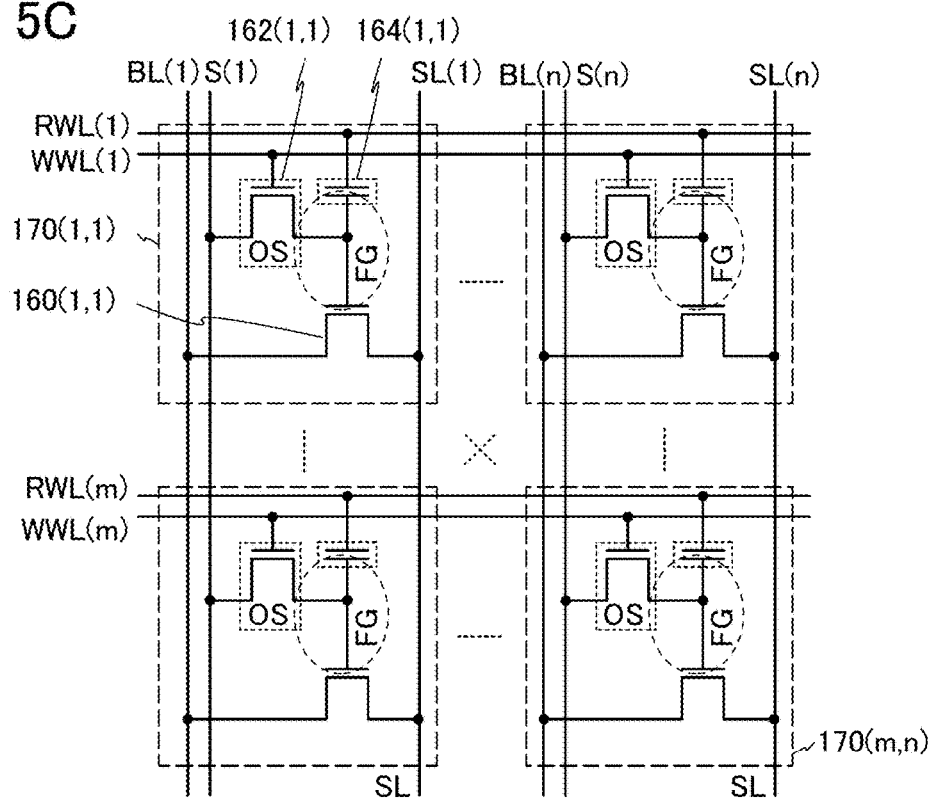

FIGS. 5A, 5B, and 5C are circuit diagrams each illustrating part of a memory cell array or an entire memory cell array including a plurality of the semiconductor devices (hereinafter also referred to as the memory cells) illustrated in FIG. 1A-1. FIGS. 5A and 5B are circuit diagrams of so-called NAND semiconductor devices in which memory cells are connected in series, and FIG. 5C is a circuit diagram of a so-called NOR semiconductor device in which memory cells are connected in parallel.

The semiconductor device illustrated in FIG. 5A includes a source line SL, a bit line BL, a signal line S, m write word lines WWL, m read word lines RWL, and m memory cells. In FIG. 5A, one source line SL and one bit line BL are provided; however, an embodiment of the disclosed invention is not limited to this. A plurality of source lines SL and a plurality of bit lines BL may be provided.

In each memory cell (a specific example of which is a memory cell $170(i)$, i is an integer of greater than or equal to 1 and less than or equal to m), a gate electrode of a transistor $160(i)$, a drain electrode (or a source electrode) of a transistor $162(i)$, and one electrode of a capacitor $164(i)$ are electrically connected to each other. In addition, the signal line S is electrically connected to the source electrode (or the drain electrode) of the transistor $162(i)$, and a write word line WWL(i) is electrically connected to a gate electrode of the transistor $162(i)$. Further, a read word line RWL(i) is electrically connected to the other electrode of the capacitor $164(i)$.

Further, a drain electrode of the transistor $160(i)$ included in the memory cell $170(i)$ is electrically connected to a source electrode of a transistor $160(i-1)$ in the adjacent memory cell $170(i-1)$. A source electrode of the transistor $160(i)$ included in the memory cell $170(i)$ is electrically connected to a drain electrode of a transistor $160(i+1)$ in the adjacent memory cell $170(i+1)$. Note that a drain electrode of a transistor $160(1)$ included in a memory cell $170(1)$ among the m memory cells connected in series is electrically connected to the bit line BL. In addition, a source electrode of a transistor $160(m)$ included in a memory cell $170(m)$ among the m memory cells connected in series is electrically connected to the source line SL.

The transistor $160(1)$ in the memory cell $170(1)$ may be electrically connected to the bit line BL through a selection transistor (not illustrated). In that case, a selection line G1 is connected to a gate electrode of the selection transistor. Further, the transistor $160(m)$ in the memory cell $170(m)$ may be electrically connected to the source line SL through a selection transistor (not illustrated). In that case, a selection line G2 is connected to a gate electrode of the selection transistor.

In the semiconductor device in FIG. 5A, a writing operation and a reading operation are performed row by row. The writing operation is performed as follows. A potential which allows the transistor $162(i)$ to be turned on is supplied to the write word line WWL(i) of a row subjected to writing (e.g., the i-th row), so that the transistor $162(i)$ in the row subjected to writing is turned on. Accordingly, the potential of a signal line S is supplied to the gate electrode of the transistor $160(i)$ of the specified row, so that a predetermined amount of electric charge is supplied to the gate electrode of the transistor $160(i)$. Thus, data can be written to the memory cell of the specified row.

Further, the reading operation is performed as follows. A potential which allows the transistors 160 of the rows other than the row subjected to reading (e.g., the i-th row) be turned on, regardless of the electric charge supplied to the gate electrodes of the transistors 160, is supplied to the read word lines RWL of the rows other than the row subjected to reading, so that the transistors 160 of the rows other than the row subjected to reading are turned on. Then, a potential (reading potential) at which an on state or an off state of the transistor $160(i)$ is determined depending on electric charge in the gate electrode of the transistor $160(i)$ is supplied to the read word line RWL(i) of the row subjected to reading. In addition, a fixed potential is supplied to the source line SL and a reading circuit (not illustrated) connected to the bit line BL is operated. Here, among the plurality of transistors $160(1)$ to $160(m)$ between the source line SL and the bit line BL, all the transistors 160 except the transistor $160(i)$ in the row subjected to reading are in an on state; therefore, the level of the conductance between the source line SL and the bit line BL is determined by the state (the on state or the off state) of the transistor $160(i)$ in the row subjected to reading. The state (the on state or the off state) of the transistor $160(i)$ is determined depending on the electric charge in the gate electrode of the transistor $160(i)$ in the row subjected to reading; thus, the potential of the bit line BL varies accordingly. By reading the potential of the bit line BL with the reading circuit, data can be read from the memory cell of the specified row.

FIG. 5B illustrates a semiconductor device whose structure is partly different from that in FIG. 5A.

One of differences between the semiconductor device in FIG. 5A and the semiconductor device in FIG. 5B is that the bit line BL and the drain electrode of the transistor $160(1)$ in the memory cell $170(1)$ are electrically connected to each other through a selection transistor 530 in the semiconductor device in FIG. 5B. A gate electrode of the selection transistor 530 is electrically connected to the selection line G1 for switching between the on state and the off state of the selection transistor 530.

Another difference between the semiconductor device in FIG. 5A and the semiconductor device in FIG. 5B is that the source electrode (or the drain electrode) of the transistor 162 in each memory cell is connected to the signal line S in the semiconductor device in FIG. 5A, whereas the transistors 162 in the memory cells are connected in series in the semiconductor device in FIG. 5B. That is, the source electrode of the transistor $162(i)$ in the memory cell $170(i)$ is electrically connected to the drain electrode of the transistor $162(i-1)$ in the adjacent memory cell $170(i-1)$. The drain electrode of the transistor $162(i)$ included in the memory cell $170(i)$ is electrically connected to the source electrode of the transistor $162(i+1)$ in the adjacent memory cell $170(i+1)$. Note that the source electrode of the transistor $162(1)$ in the memory cell $170(1)$ among the m memory cells connected in series is electrically connected to the signal line S. Moreover, in each of the memory cells connected in series, the drain electrode of the transistor $162(i)$ is electrically connected to the gate electrode of the transistor $160(i)$ and one electrode of the capacitor $164(i)$ as in the semiconductor device in FIG. 5A.

The structure of other portions of the semiconductor device in FIG. 5B is similar to that of the semiconductor device in FIG. 5A; therefore, the above description can be referred to for the details.

Note that the signal line S and the bit line BL are separately provided in the semiconductor device in FIG. 5B; however, an embodiment of the disclosed invention is not limited to this structure. The signal line S and the bit line BL may be one wiring.

Also in the semiconductor device in FIG. 5B, a writing operation and a reading operation are performed row by row. The writing operation is performed as follows.

The writing operation is sequentially performed row by row from the m-th row. In the writing operation of the i-th row (i is one of 1 to m), a potential which allows the transistor 162(i) to be turned on is supplied to the write word line WWL(i) of the row subjected to writing (the i-th row), so that the transistor 162(i) of the row subjected to writing is turned on. Here, when the transistors 162(1) to 162(i−1) are present between the transistor 162(i) and the signal line S, the transistors 162(1) to 162(i−1) of the rows preceding the row subjected to reading are turned on, and the potential of the signal line S is supplied to the memory cell 170(i) of the row subjected to writing. Accordingly, the potential of the signal line S is supplied to the gate electrode of the transistor 160(i) of the specified row, so that a predetermined amount of electric charge is supplied to the gate electrode of the transistor 160(i). Then, the potential of the write word line WWL(i) is fixed to GND, so that electric charge stored in the gate electrode of the transistor 160(i) is held. In this manner, data can be written into the memory cell of the specified row (the i-th row).

Note that in the semiconductor device illustrated in FIG. 5B, the transistors 162 included in the memory cells 170 are connected in series, so that it is difficult to rewrite only data of a certain row. Therefore, an operation for erasing data in a plurality of rows at once is preferably performed as a driving method. For example, erasing per block is preferably performed, where the first to m-th rows are considered as one block. In order to rewrite data in a predetermined block, it is preferable that data in the block be erased first, and then data is written sequentially from the m-th row. Note that in the case where data is rewritten in a row which has just been subjected to writing, an erasing operation is unnecessary.

Further, the reading operation is performed as follows. First, a potential is supplied to the selection line G1 so that the selection transistor is turned on. Note that in the case where there are a selection transistor connected to the selection line G(1) and a selection transistor connected to the selection line G(2), the two transistors are turned on. In addition, a potential which allows the transistors 160 of the rows other than the row subjected to reading (e.g., the i-th row) to be turned on, regardless of the electric charge supplied to the gate electrodes of the transistors 160, is supplied to the read word lines RWL of the rows other than the row subjected to reading, so that the transistors 160 of the rows other than the row subjected to reading are turned on. Then, a potential (reading potential) at which an on state or an off state of the transistor 160(i) is determined depending on electric charge in the gate electrode of the transistor 160(i) is supplied to the read word line RWL(i) of the row subjected to reading. In addition, a fixed potential is supplied to the source line SL and a reading circuit (not illustrated) connected to the bit line BL is operated. Here, among the plurality of transistors 160(1) to 160(m) between the source line SL and the bit line BL, all the transistors 160 except the transistor 160(i) in the row subjected to reading are in an on state; therefore, the level of the conductance between the source line SL and the bit line BL is determined by the state (the on state or the off state) of the transistor 160(i) in the row subjected to reading. The state (the on state or the off state) of the transistor 160(i) is determined depending on the electric charge in the gate electrode of the transistor 160(i) in the row subjected to reading; thus, the potential of the bit line BL varies accordingly. By reading the potential of the bit line BL with the reading circuit, data can be read out from the memory cell of the specified row.

The semiconductor device illustrated in FIG. 5C includes n source lines SL, n bit lines BL, n signal lines S, m write word lines WWL, m read word lines RWL, and a plurality of memory cells 170(1, 1) to 170(m, n).

In each memory cell (a specific example of which is a memory cell 170(i, j), i is an integer of greater than or equal to 1 and less than or equal to m, and j is an integer of greater than or equal to 1 and less than or equal to n), a gate electrode of a transistor 160(i, j), a drain electrode (or a source electrode) of a transistor 162(i, j), and one electrode of a capacitor 164(i, j) are electrically connected to each other. In addition, a source line SL(j) is electrically connected to a source electrode of a transistor 160(i, j), and a bit line BL(j) is electrically connected to a drain electrode of the transistor 160(i, j). In addition, a signal line S(j) is electrically connected to the source electrode (or the drain electrode) of the transistor 162(i, j), and the write word line WWL(i) is electrically connected to a gate electrode of the transistor 162(i, j). Further, the read word line RWL(i) is electrically connected to the other electrode of the capacitor 164(i, j).

In the semiconductor device in FIG. 5C, a writing operation and a reading operation are performed row by row. The writing operation is performed in a manner similar to that of the semiconductor device in FIG. 5A. The reading operation is performed as follows. First, to the read word lines RWL of the rows other than the row subjected to reading (e.g., the memory cells (i, 1) to (i, n) in the i-th row), a potential which allows the transistors 160 that are not in the row subjected to reading to be turned off, regardless of electric charge supplied to the gate electrodes of the transistors 160(i, 1) to 160(i, n), is supplied, so that the transistors 160 in the rows other than the row subjected to reading are turned off. Then, a potential (a reading potential) at which the on state or the off state of the transistors 160(i, 1) to 160(i, n) is determined depending on the electric charge in the gate electrodes of the transistors 160(i, 1) to 160(i, n) is supplied to the read word line RWL(i) of the row subjected to reading. In addition, a constant potential is supplied to the source line SL(j), and a reading circuit (not illustrated) connected to the bit line BL(j) is operated. Here, the level of the conductance between the source line SL(j) and the bit line BL(j) is determined by the state (the on state or the off state) of the transistors 160(i, 1) to 160(i, n) in the row subjected to reading. That is, the potential of the bit line BL(j) varies depending on the electric charge in the gate electrodes of the transistors 160(i, 1) to 160(i, n) in the row subjected to reading. By reading the potential of the bit line BL(j) with the reading circuit, data can be read from the memory cell of the specified row.

Although the amount of data held in each of the memory cells 170 is one bit in the above description, the structure of the semiconductor device of this embodiment is not limited to this example. The amount of data held in each memory cell 170 may be increased by preparation of three or more kinds of potentials to be supplied to the gate electrode of the transistor 160 at the time of writing. For example, in the case where four kinds of potentials are supplied to the gate electrode of the transistor 160 in writing, data of two bits can be held in each of the memory cells.

In FIGS. 5A to 5C, the signal line S and the bit line BL may be one wiring. When one wiring serves as both the signal line S and the bit line BL, the number of wirings can be reduced. Further, in FIG. 5C, the source line SL may be shared by a plurality of memory cells.

Instead of the memory cell array 201 illustrated in FIG. 2A or FIG. 3A, the NAND semiconductor device illustrated in FIG. 5A or 5B may be used. In that case, the NAND semiconductor devices illustrated in FIG. 5A or 5B may be arranged in n columns. In addition, instead of the memory cell array 201 illustrated in FIG. 2A or FIG. 3A, the NOR semiconductor device illustrated in FIG. 5C may be used.

The semiconductor device according to an embodiment of the disclosed invention is operated by switching of the transistor 162 and holds electric charge in the node FG for a long time by utilizing a significantly small off-state current of the transistor 162. Therefore, when a signal such as a short pulse or a noise which is different from a control signal is input to the write word line WWL electrically connected to the gate electrode of the transistor 162 and the transistor 162 is instantaneously turned on, data written into the memory cell 170 might be erased.

In the semiconductor device according to an embodiment of the disclosed invention, by providing the capacitor 250 or the noise removal circuit 260 that is electrically connected to the write word line WWL as illustrated in FIGS. 2A to 2C, FIGS. 3A to 3C, and FIGS. 4A to 4F, a signal such as a short pulse or a noise which is different from a control signal can be reduced or removed. Accordingly, a malfunction in which data written into the memory cell 170 is erased when the transistor 162 in the memory cell 170 is instantaneously turned on can be prevented.

The structures, methods, and the like described in this embodiment can be combined as appropriate with any of the structures, methods, and the like described in the other embodiments.

Embodiment 4

In this embodiment, a structure and a manufacturing method of a semiconductor device according to an embodiment of the disclosed invention will be described with reference to FIGS. 6A and 6B, FIG. 7, FIGS. 8A to 8G, FIGS. 9A to 9E, FIGS. 10A to 10D, FIGS. 11A to 11D, FIGS. 12A to 12C, FIGS. 13A and 13B, and FIGS. 14A to 14C.

<Cross-sectional Structure and Planar Structure of Semiconductor Device>

Figure 6A:
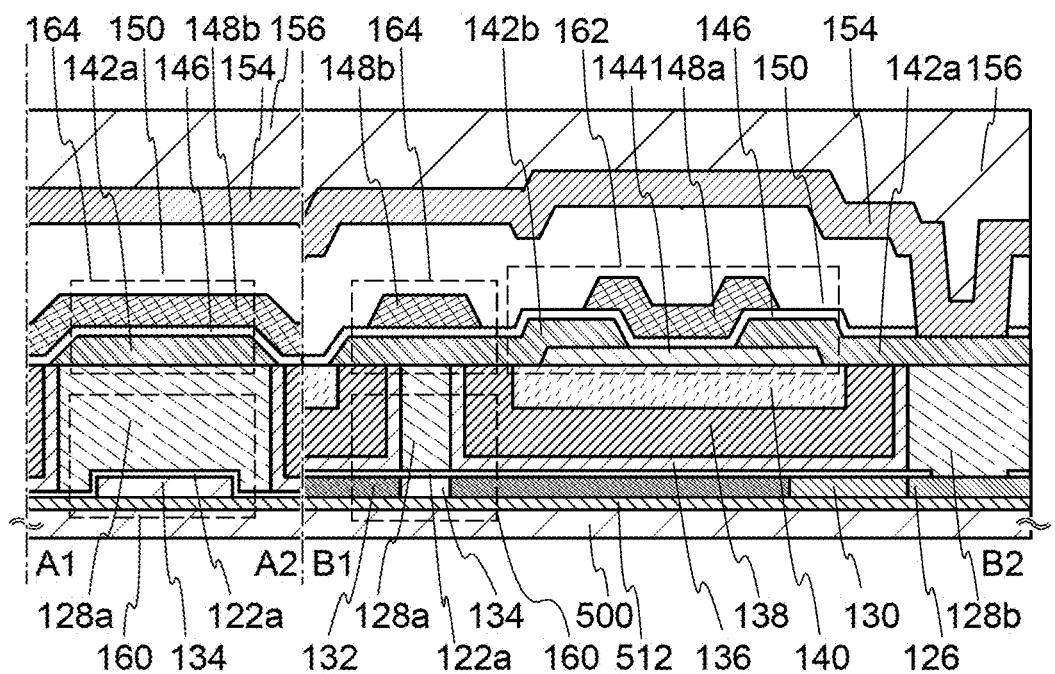
FIGS. 6A and 6B are a cross-sectional view and a plan view of a semiconductor device.
Figure 6B:
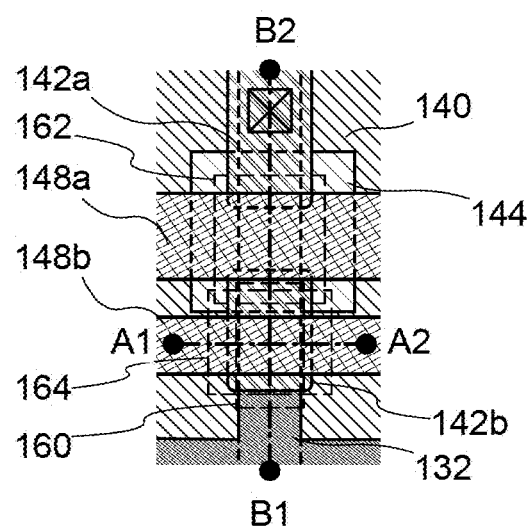

FIGS. 6A and 6B illustrate an example of a structure of a memory cell included in a semiconductor device. FIG. 6A is a cross-sectional view of the memory cell included in the semiconductor device, and FIG. 6B is a plan view of the memory cell included in the semiconductor device. Here, FIG. 6A corresponds to a cross-section taken along line A1-A2 and line B1-B2 of FIG. 6B. The semiconductor device illustrated in FIGS. 6A and 6B includes a transistor 160 including a first semiconductor material in a lower portion, and a transistor 162 including a second semiconductor material in an upper portion. Here, the first semiconductor material is preferably different from the second semiconductor material. For example, a semiconductor material other than an oxide semiconductor can be used as the first semiconductor material, and an oxide semiconductor can be used as the second semiconductor material. The semiconductor material other than an oxide semiconductor can be, for example, silicon, germanium, silicon germanium, silicon carbide, gallium arsenide, or the like and is preferably single crystal. Alternatively, an organic semiconductor material or the like may be used. A transistor including such a semiconductor material other than an oxide semiconductor can operate at high speed easily. On the other hand, a transistor including an oxide semiconductor can hold electric charge for a long time owing to its characteristics. The semiconductor device in FIGS. 6A and 6B can be used as a memory cell.

Since the technical nature of the disclosed invention is to use a semiconductor material with which off-state current can be sufficiently decreased, such as an oxide semiconductor, in the transistor 162 so that data can be held, it is not necessary to limit a specific structure of the semiconductor device, such as a material of the semiconductor device or a structure of the semiconductor device, to those described here.

The transistor 160 in FIGS. 6A and 6B includes a channel formation region 134 provided in a semiconductor layer over a semiconductor substrate 500, impurity regions 132 (also referred to as a source region and a drain region) with the channel formation region 134 provided therebetween, a gate insulating layer 122a provided over the channel formation region 134, and a gate electrode 128a provided over the gate insulating layer 122a so as to overlap with the channel formation region 134. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

Further, a conductive layer 128b is connected to an impurity region 126 provided in the semiconductor layer over the semiconductor substrate 500. Here, the conductive layer 128b functions as a source electrode or a drain electrode of the transistor 160. In addition, an impurity region 130 is provided between the impurity region 132 and the impurity region 126. Further, insulating layers 136, 138, and 140 are provided so as to cover the transistor 160. Note that for high integration, it is preferable that, as in FIGS. 6A and 6B, the transistor 160 does not have a sidewall insulating layer. On the other hand, when importance is put on the characteristics of the transistor 160, sidewall insulating layers may be provided on side surfaces of the gate electrode 128a, and the impurity region 132 may include regions with a different impurity concentration.

The transistor 162 in FIGS. 6A and 6B includes an oxide semiconductor layer 144 provided over the insulating layer 140 and the like, a source electrode (or a drain electrode) 142a and a drain electrode (or a source electrode) 142b that are electrically connected to the oxide semiconductor layer 144, a gate insulating layer 146 for covering the oxide semiconductor layer 144, the source electrode 142a, and the drain electrode 142b, and a gate electrode 148a provided over the gate insulating layer 146 so as to overlap with the oxide semiconductor layer 144.

Here, the oxide semiconductor layer 144 is preferably a highly purified oxide semiconductor layer by sufficiently removing impurities such as hydrogen or sufficiently supplying oxygen. Specifically, the hydrogen concentration in the oxide semiconductor layer 144 is lower than or equal to $5\times10^{19}$ atoms/cm$^3$, preferably lower than or equal to $5\times10^{18}$ atoms/cm$^3$, more preferably lower than or equal to $5\times10^{17}$ atoms/cm$^3$. Note that the hydrogen concentration in the oxide semiconductor layer 144 is measured by secondary ion mass spectrometry (SIMS). In the oxide semiconductor layer 144 which is highly purified by sufficiently reducing the concentration of hydrogen therein and in which defect levels in an energy gap due to oxygen deficiency are reduced by supplying a sufficient amount of oxygen, the carrier concentration is lower than $1\times10^{12}$/cm$^3$, preferably lower than $1\times10^{11}$/cm$^3$, more preferably lower than $1.45\times10^{10}$/cm$^3$. For example, the off-state current (here, current per micrometer (μm) of channel width) at room temperature (25° C.) is less than or equal to 100 zA (1 zA (zeptoampere) is $1\times10^{-21}$ A), preferably less than or equal to 10 zA. In this manner, by using an oxide semiconductor which is made to be an i-type (intrinsic) oxide semiconductor or a substantially i-type oxide semiconductor, the transistor 162 which has extremely favorable off-state current characteristics can be obtained.

In addition, it is preferable that the concentration of an alkali metal or an alkaline earth metal be sufficiently decreased in the oxide semiconductor layer 144. The concentration of an alkali metal or an alkaline earth metal is decreased to such a degree that, for example, the concentration of Na is lower than or equal to $5\times10^{16}$ cm$^{-3}$, preferably lower than or equal to $1\times10^{16}$ cm$^{-3}$, more preferably lower than or equal to $1\times10^{15}$ cm$^{-3}$, the concentration of Li is lower than or equal to $5\times10^{15}$ cm$^{-3}$, preferably lower than or equal to $1\times10^{15}$ cm$^{-3}$, and the concentration of K is lower than or equal to $5\times10^{15}$ cm$^{-3}$, preferably lower than or equal to $1\times10^{15}$ cm$^{-3}$ when measured through an SIMS analysis.

Note that it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Carrier Transport Properties and Electronic Structures of Amorphous Oxide Semiconductors: The present status", *KOTAI BUTSURI* (*SOLID STATE PHYSICS*), 2009, Vol. 44, pp. 621-633). But such consideration is not appropriate. An alkali metal and an alkaline earth metal are adverse impurities for the oxide semiconductor and are preferably contained as little as possible. An alkali metal, in particular, Na diffuses into an oxide and becomes Na$^+$ when an insulating film in contact with the oxide semiconductor is an oxide. In addition, Na cuts a bond between metal and oxygen or enters the bond in the oxide semiconductor. As a result, transistor characteristics deteriorate (e.g., the transistor becomes normally-on (the shift of a threshold voltage to a negative side) or the mobility is decreased). In addition, this also causes variation in the characteristics. Such a problem is significant especially in the case where the hydrogen concentration in the oxide semiconductor is sufficiently low. Therefore, the concentration of an alkali metal is strongly required to set to the above value in the case where the hydrogen concentration in the oxide semiconductor is lower than or equal to $5\times10^{19}$ cm$^{-3}$, particularly lower than or equal to $5\times10^{18}$ cm$^-$.

In addition, the oxide semiconductor is preferably a semiconductor in which the Fermi level ($E_f$) and the intrinsic Fermi level ($E_i$) are equivalent ($E_f=E_i$) or the intrinsic Fermi level ($E_1$) is higher than the Fermi level ($E_f$) ($E_f<E_i$), that is, a so-called p$^-$-type semiconductor. For example, tin is added to an oxide semiconductor as a dopant, whereby a p$^-$-type oxide semiconductor can be obtained. Note that when an oxide semiconductor is i-type (intrinsic) or substantially i-type, the Fermi level ($E_f$) is more easily controlled by adding an impurity, which is preferable. Further, for a gate electrode, a material having a high work function ($\varphi_M$) is preferably used. With the above structure, the transistor can be normally off and it is effective that a reverse bias is applied to the transistor. Thus, a transistor with small off-state current which is, for example, less than or equal to 1 yA at 85° C. and less than or equal to 0.1 yA at room temperature, can be obtained; by using the transistor as a memory element, a semiconductor device with improved data holding characteristics (memory retention) can be obtained.

Although the oxide semiconductor layer 144 which is processed to have an island shape is used in order to suppress leakage current generated between elements due to miniaturization in the transistor 162 of FIGS. 6A and 6B, a structure including the oxide semiconductor layer 144 which is not processed to have an island shape may be employed. In the case where the oxide semiconductor layer is not processed to have an island shape, contamination of the oxide semiconductor layer 144 due to etching in the processing can be prevented.

A capacitor 164 in FIGS. 6A and 6B includes the drain electrode 142*b*, the gate insulating layer 146, and a conductive layer 148*b*. That is to say, the drain electrode 142*b* functions as one electrode of the capacitor 164, and the conductive layer 148*b* functions as the other electrode of the capacitor 164. With such a structure, sufficient capacitance can be secured. Further, in the capacitor 164, insulating properties between the drain electrode 142*b* and the conductive layer 148*b* can be adequately secured by stacking the oxide semiconductor layer 144 and the gate insulating layer 146. Further alternatively, the capacitor 164 may be omitted in the case where a capacitor is not needed.

In this embodiment, the transistor 162 and the capacitor 164 are provided so as to overlap with the transistor 160 at least partly. By employing such a planar layout, high integration can be realized. For example, given that the minimum feature size is F, the area of the memory cell can be 15 F$^2$ to 25 F$^2$.

An insulating layer 150 is provided over the transistor 162 and the capacitor 164. A wiring 154 is provided in an opening formed in the gate insulating layer 146 and the insulating layer 150. The wiring 154 is a wiring which connects one memory cell to another memory cell and corresponds to the wiring serving as both the bit line BL and the signal line S in the circuit diagram in FIGS. 1A-1 to 1B, FIGS. 2A to 2C, and FIGS. 3A to 3C. The wiring 154 is electrically connected to the impurity region 126 through the source electrode 142*a* and the conductive layer 128*b*. The above structure allows reduction in the number of wirings as compared to a structure in which the source region or the drain region in the transistor 160 and the source electrode 142*a* in the transistor 162 are connected to different wirings. Thus, the integration degree of the semiconductor device can be increased.

Since the conductive layer 128*b* is provided, a position where the impurity region 126 and the source electrode 142*a* are connected and a position where the source electrode 142*a* and the wiring 154 are connected can overlap with each other. With such a planar layout, the element area can be prevented from increasing due to contact regions. In other words, the degree of integration of the semiconductor device can be increased.

Figure 2B:
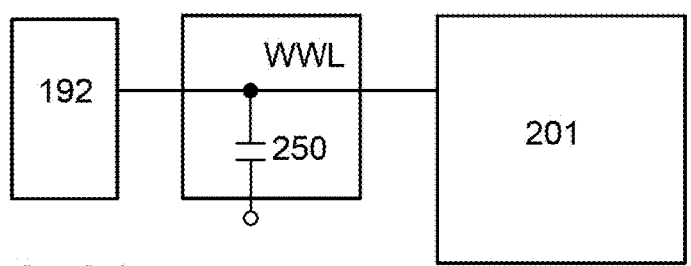
Figure 2C:
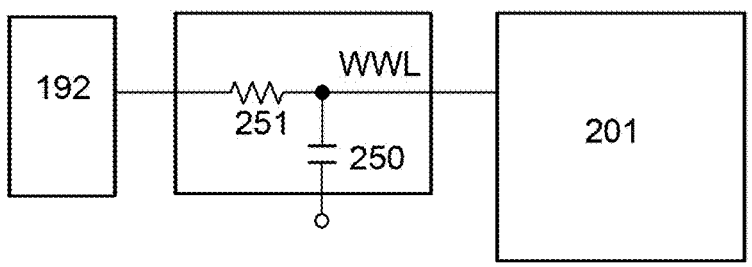
Figure 7:
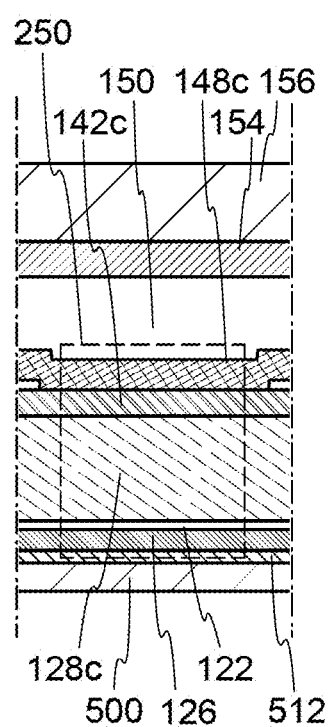
FIG. 7 is a cross-sectional view of a semiconductor device.

FIG. 7 illustrates an example of a cross section of the capacitor 250 which is electrically connected to the write word line WWL in the case where the semiconductor device has the structure illustrated in FIGS. 2A to 2C.

The capacitor 250 illustrated in FIG. 7 includes the impurity region 126 provided in the semiconductor layer, an insulating layer 122 provided in the same layer as the gate insulating layer 122*a*, a conductive layer 128*c* provided in the same layer as the gate electrode 128*a*, a conductive layer 142*c* provided in the same layer as the source electrode 142*a* and the drain electrode 142*b*, and a conductive layer 148*c* provided in the same layer as the gate electrode 148*a*. The conductive layer 128*c*, the conductive layer 142*c*, and the conductive layer 148*c* are electrically connected to each other and serve as one electrode of the capacitor 250. The impurity region 126 serves as the other electrode of the capacitor 250. The insulating layer 122 serves as a dielectric of the capacitor 250. With such a structure, sufficient capacitance can be secured. Note that the capacitor 250 is not limited to the above structure. The capacitor 250 may be formed using any of the semiconductor layer, the insulating layer, and the conductive layer included in the semiconductor device illustrated in FIGS. 6A and 6B. For example, a structure similar to that of the capacitor 164 illustrated in FIGS. 6A and 6B may be employed as the capacitor 250.

<Manufacturing Method of SOI Substrate>

Next, an example of a manufacturing method of an SOI substrate used for forming the above semiconductor device will be described with reference to FIGS. 8A to 8G.

Figure 8A:
FIGS. 8A to 8G are cross-sectional views relating to manufacturing steps of an SOI substrate.
Figure 8B:
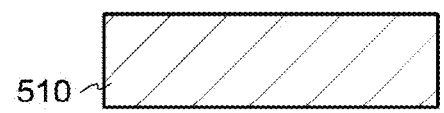

First, the semiconductor substrate 500 is prepared as a base substrate (see FIG. 8A). As the semiconductor substrate 500, a semiconductor substrate such as a single crystal silicon substrate or a single crystal germanium substrate can be used. In addition, as the semiconductor substrate, a solar grade silicon (SOG-Si) substrate or the like may be used. Alternatively, a polycrystalline semiconductor substrate may be used. In the case of using a SOG-Si substrate, a polycrystalline semiconductor substrate, or the like, manufacturing cost can be reduced as compared to the case of using a single crystal silicon substrate or the like.

Instead of the semiconductor substrate 500, any of the following substrates can be used: a variety of glass substrates used in the electronics industry, such as substrates of aluminosilicate glass, aluminoborosilicate glass, and barium borosilicate glass; a quartz substrate; a ceramic substrate; a sapphire substrate; and the like. Further, a ceramic substrate which contains silicon nitride and aluminum nitride as its main components and whose coefficient of thermal expansion is close to that of silicon may be used.

A surface of the semiconductor substrate 500 is preferably cleaned in advance. Specifically, the semiconductor substrate 500 is subjected to cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), or the like.

Next, a bond substrate is prepared. Here, a single crystal semiconductor substrate 510 is used as the bond substrate (see FIG. 8B). Note that although a substrate whose crystallinity is single crystal is used as the bond substrate here, the crystallinity of the bond substrate is not necessarily limited to single crystal.

For example, as the single crystal semiconductor substrate 510, a single crystal semiconductor substrate formed using an element of Group 14, such as a single crystal silicon substrate, a single crystal germanium substrate, or a single crystal silicon germanium substrate, can be used. Further, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 510 is not limited to circular, and the single crystal semiconductor substrate 510 may be a substrate which has been processed into, for example, a rectangular shape or the like. Further, the single crystal semiconductor substrate 510 can be formed by a Czochralski (CZ) method or a Floating Zone (FZ) method.

Figure 8C:
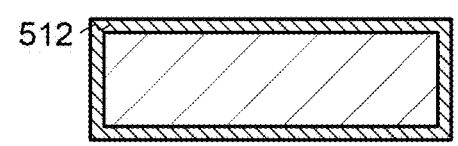

An oxide film 512 is formed on a surface of the single crystal semiconductor substrate 510 (see FIG. 8C). In view of removal of contamination, it is preferable that the surface of the single crystal semiconductor substrate 510 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before the formation of the oxide film 512. Alternatively, diluted hydrofluoric acid and ozone water may be discharged alternately to clean the surface of the single crystal semiconductor substrate 510.

The oxide film 512 can be formed with, for example, a single layer or a stacked layer of a silicon oxide film, a silicon oxynitride film, and the like. As a method for forming the oxide film 512, a thermal oxidation method, a CVD method, a sputtering method, or the like can be used. When the oxide film 512 is formed by a CVD method, a silicon oxide film is preferably formed using organosilane such as tetraethoxysilane (abbreviation: TEOS) (chemical formula: $Si(OC_2H_5)_4$), so that favorable bonding can be achieved.

In this embodiment, the oxide film 512 (here, a $SiO_x$ film) is formed by performing thermal oxidation treatment on the single crystal semiconductor substrate 510. The thermal oxidation treatment is preferably performed in an oxidizing atmosphere to which a halogen is added.

For example, thermal oxidation treatment of the single crystal semiconductor substrate 510 is performed in an oxidizing atmosphere to which chlorine (Cl) is added, whereby the oxide film 512 can be formed through chlorine oxidation. In this case, the oxide film 512 is a film containing chlorine atoms. By such chlorine oxidation, heavy metal (e.g., Fe, Cr, Ni, or Mo) that is an extrinsic impurity is trapped and chloride of the metal is formed and then vaporized; thus, contamination of the single crystal semiconductor substrate 510 can be reduced.

Note that the halogen atoms contained in the oxide film 512 are not limited to chlorine atoms. Fluorine atoms may be contained in the oxide film 512. As a method for fluorine oxidation of the surface of the single crystal semiconductor substrate 510, a method in which the single crystal semiconductor substrate 510 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Figure 8D:
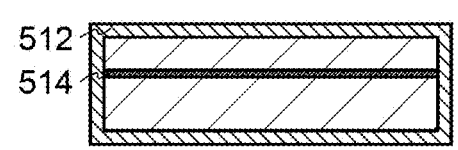
Figure 8E:
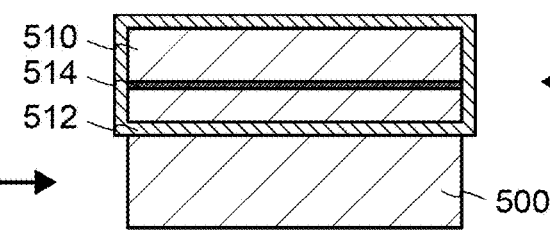

Next, ions are accelerated by an electric field and the single crystal semiconductor substrate 510 is irradiated with the ions and the ions are added thereto, whereby an embrittled region 514 where the crystal structure is damaged is formed in the single crystal semiconductor substrate 510 at a predetermined depth (see FIG. 8D).

The depth at which the embrittled region 514 is formed can be adjusted by the kinetic energy, mass, electric charge, or incidence angle of the ions, or the like. The embrittled region 514 is formed at approximately the same depth as the average penetration depth of the ions. Therefore, the thickness of a single crystal semiconductor layer to be separated from the single crystal semiconductor substrate 510 can be adjusted with the depth at which the ions are added. For example, the average penetration depth may be controlled such that the thickness of the single crystal semiconductor layer is approximately greater than or equal 10 nm and less than or equal to 500 nm, preferably greater than or equal 50 nm less than or equal to 200 nm.

The above ion irradiation treatment can be performed with an ion doping apparatus or an ion implantation apparatus. As a typical example of the ion doping apparatus, there is a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, an ion implantation apparatus is a mass-separation-type apparatus. In the ion implantation apparatus, mass separation of ion species of plasma is performed and the object to be processed is irradiated with ion species having predetermined masses.

In this embodiment, an example is described in which an ion doping apparatus is used to add hydrogen to the single crystal semiconductor substrate 510. A gas containing hydrogen is used as a source gas. As for ions used for the irradiation, the proportion of $H_3^+$ is preferably set high. Specifically, it is preferable that the proportion of $H_3^+$ be set higher than or equal to 50% (more preferably, higher than or equal to 80%) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium concurrently using an ion doping apparatus, the number of steps can be reduced as compared to the case of performing irradiation with hydrogen and helium in different steps, and surface roughness of the single crystal semiconductor layer to be formed later can be suppressed.

Note that heavy metal may also be added when the embrittled region 514 is formed with the ion doping apparatus; however, when the ion irradiation is performed through the oxide film 512 containing halogen atoms, contamination of the single crystal semiconductor substrate 510 due to the heavy metal can be prevented.

Then, the semiconductor substrate 500 and the single crystal semiconductor substrate 510 are disposed to face each other and are closely attached to each other with the oxide film 512 therebetween. Thus, the semiconductor substrate 500 and the single crystal semiconductor substrate 510 can be bonded to each other (see FIG. 8E). Note that an oxide film or a nitride film may be formed on the surface of the semiconductor substrate 500 to which the single crystal semiconductor substrate 510 is attached.

When bonding is performed, it is preferable that a pressure of greater than or equal to 0.001 $N/cm^2$ and less than or equal to 100 $N/cm^2$, e.g., a pressure of greater than or equal to 1 $N/cm^2$ and less than or equal to 20 $N/cm^2$, be applied to one part of the semiconductor substrate 500 or one part of the single crystal semiconductor substrate 510. When the bonding surfaces are made close to each other and disposed in close contact with each other by applying a pressure, a bonding between the semiconductor substrate 500 and the oxide film 512 is generated at the part where the close contact is made, and the bonding spontaneously spreads to almost the entire area. This bonding is performed under the action of the Van der Waals force or hydrogen bonding and can be performed at room temperature.

Note that before the single crystal semiconductor substrate 510 and the semiconductor substrate 500 are bonded to each other, surfaces to be bonded are preferably subjected to surface treatment. Surface treatment can improve the bonding strength at the interface between the single crystal semiconductor substrate 510 and the semiconductor substrate 500.

As the surface treatment, wet treatment, dry treatment, or a combination of wet treatment and dry treatment can be used. Alternatively, wet treatment may be used in combination with different wet treatment or dry treatment may be used in combination with different dry treatment.

Note that heat treatment for increasing the bonding strength may be performed after bonding. This heat treatment is performed at a temperature at which separation at the embrittled region 514 does not occur (for example, a temperature of higher than or equal to room temperature and lower than 400° C.). Alternatively, bonding of the semiconductor substrate 500 and the oxide film 512 may be performed while heating them at a temperature in the above range. The heat treatment can be performed using a diffusion furnace, a heating furnace such as a resistance heating furnace, a rapid thermal annealing (RTA) apparatus, a microwave heating apparatus, or the like. The above temperature condition is merely an example, and an embodiment of the disclosed invention should not be construed as being limited to this example.

Figure 8F:
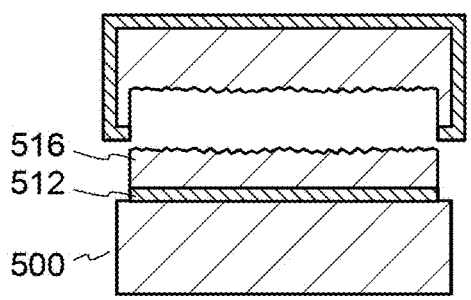

Next, heat treatment is performed for separation of the single crystal semiconductor substrate 510 at the embrittlement region, whereby a single crystal semiconductor layer 516 is formed over the semiconductor substrate 500 with the oxide film 512 provided therebetween (FIG. 8F).

Note that the temperature for heat treatment in the separation is desirably as low as possible. This is because as the temperature in the separation is low, generation of roughness on the surface of the single crystal semiconductor layer 516 can be suppressed. Specifically, the temperature of the heat treatment in the separation may be higher than or equal to 300° C. and lower than or equal to 600° C., and the heat treatment is more effective when the temperature is lower than or equal to 500° C. (higher than or equal to 400° C.).

Note that after the single crystal semiconductor substrate 510 is separated, the single crystal semiconductor layer 516 may be subjected to heat treatment at higher than or equal to 500° C. so that concentration of hydrogen remaining in the single crystal semiconductor layer 516 is reduced.

Figure 8G:
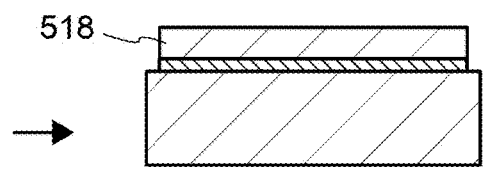

Then, the surface of the single crystal semiconductor layer 516 is irradiated with laser light, whereby a single crystal semiconductor layer 518 in which the planarity of the surface is improved and the number of defects is reduced is formed (see FIG. 8G). Note that instead of the laser light irradiation treatment, heat treatment may be performed.

Although the laser light irradiation treatment is performed immediately after the heat treatment for separation of the single crystal semiconductor layer 516 in this embodiment, an embodiment of the present invention is not construed as being limited to this. Etching treatment may be performed after the heat treatment for separation of the single crystal semiconductor layer 516, to remove a region where there are many defects on the surface of the single crystal semiconductor layer 516, and then, the laser light irradiation treatment may be performed. Alternatively, after the surface planarity of the single crystal semiconductor layer 516 is improved, the laser light irradiation treatment may be performed. Note that the etching treatment may be either wet etching or dry etching. Further, in this embodiment, a step of reducing the thickness of the single crystal semiconductor layer 516 may be performed after the laser light irradiation. In order to reduce the thickness of the single crystal semiconductor layer 516, any one of or both dry etching and wet etching may be employed.

Through the above steps, an SOI substrate including the single crystal semiconductor layer 518 with favorable characteristics can be obtained (see FIG. 8G).

<Method for Manufacturing Semiconductor Device>

Next, a method for manufacturing a semiconductor device with the use of the SOI substrate described above will be described with reference to FIGS. 9A to 9E, FIGS. 10A to 10D, FIGS. 11A to 11D, and FIGS. 12A to 12C.

<Method for Manufacturing Transistor in Lower Portion>

First, a manufacturing method of the transistor 160 in the lower portion will be described with reference to FIGS. 9A to 9E and FIGS. 10A to 10D. Note that FIGS. 9A to 9E and FIGS. 10A to 10D illustrate part of the SOI substrate formed by the method illustrated in FIGS. 8A to 8G, and are cross-sectional views illustrating the steps for manufacturing the transistor in the lower portion illustrated in FIG. 6A.

Figure 9A:
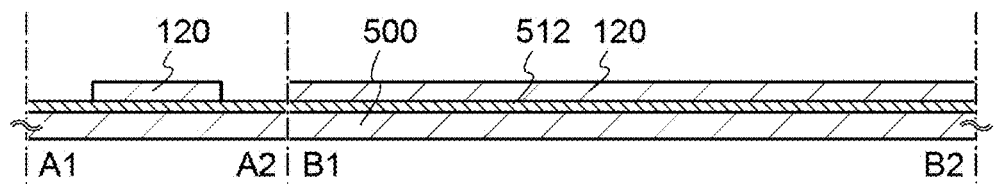
FIGS. 9A to 9E are cross-sectional views relating to manufacturing steps of a semiconductor device.

First, the single crystal semiconductor layer 518 is patterned to have an island shape, so that a semiconductor layer 120 is formed (see FIG. 9A). Note that before or after this step, an impurity element imparting n-type conductivity or an impurity element imparting p-type conductivity may be added to the semiconductor layer in order to control the threshold voltage of the transistor. In the case where silicon is used as the semiconductor, phosphorus, arsenic, or the like can be used as the impurity element imparting n-type conductivity. On the other hand, boron, aluminum, gallium, or the like can be used as the impurity element imparting p-type conductivity.

Figure 9B:
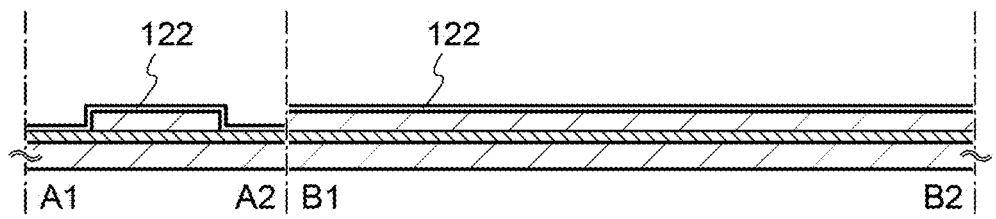

Next, an insulating layer 122 is formed so as to cover the semiconductor layer 120 (see FIG. 9B). The insulating layer 122 is to be a gate insulating layer later. The insulating layer 122 can be formed, for example, by performing heat treatment (thermal oxidation treatment, thermal nitridation treatment, or the like) on a surface of the semiconductor layer 120. Instead of heat treatment, high-density plasma treatment may be employed. The high-density plasma treatment can be performed using, for example, a mixed gas of a rare gas such as He, Ar, Kr, or Xe and any of oxygen, nitrogen oxide, ammonia, nitrogen, and hydrogen. Needless to say, the insulating layer may be formed using a CVD method, a sputtering method, or the like. The insulating layer 122 preferably has a single-layer structure or a layered structure using one or more of silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>>0, y>0)) to which nitrogen is added, hafnium aluminate (HfAl$_x$O$_y$ (x>0, y>0)) to which nitrogen is added, and the like. The thickness of the insulating layer 122 may be, for example, greater than or equal to 1 nm and less than or equal to 100 nm, preferably greater than or equal to 10 nm and less than or equal to 50 nm Here, a single-layer insulating layer containing silicon oxide is formed using a plasma CVD method.

Figure 9C:
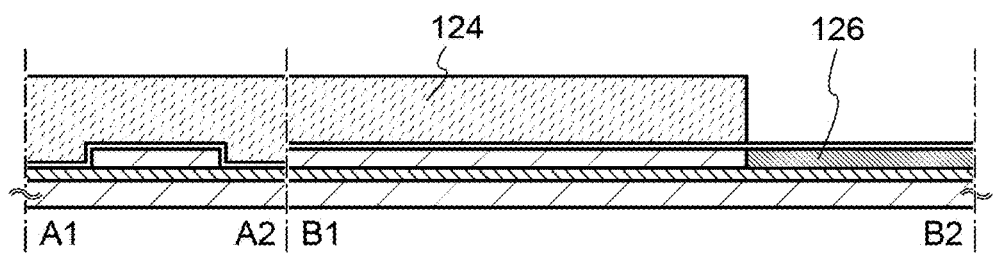

Next, a mask 124 is formed over the insulating layer 122 and an impurity element imparting one conductivity type is added to the semiconductor layer 120, so that the impurity region 126 is formed (see FIG. 9C). Note that the mask 124 is removed after the impurity element is added.

Figure 9D:
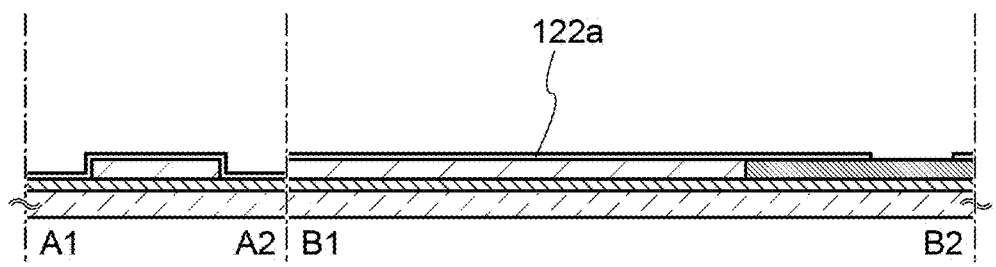

Next, a mask is formed over the insulating layer 122 and a region of the insulating layer 122 that overlaps with the impurity region 126 is partly removed, so that the gate insulating layer 122*a* is formed (see FIG. 9D). Part of the insulating layer 122 can be removed by etching such as wet etching or dry etching.

Figure 9E:
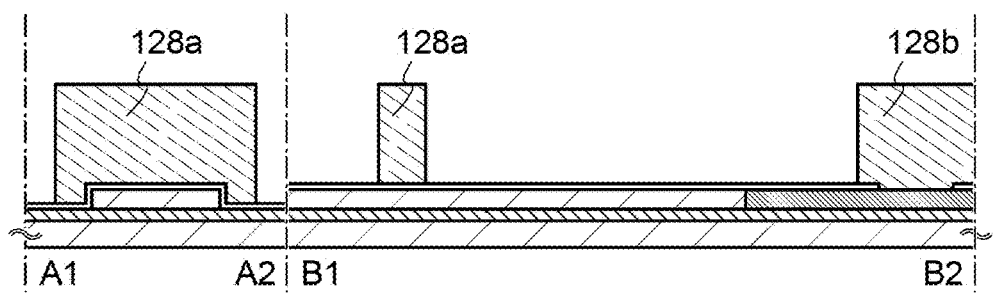

Next, a conductive layer for forming a gate electrode (including a wiring formed using the same layer as the gate electrode) is formed over the gate insulating layer 122*a* and is processed, so that the gate electrode 128*a* and the conductive layer 128*b* are formed (see FIG. 9E).

The conductive layer for forming the gate electrode 128*a* and the conductive layer 128*b* can be formed using a metal material such as aluminum, copper, titanium, tantalum, or tungsten. The conductive layer may be formed using a semiconductor material such as polycrystalline silicon. There is no particular limitation on the method for forming the conductive layer, and a variety of film formation methods such as an evaporation method, a CVD method, a sputtering method, and a spin coating method can be employed. The conductive layer may be processed by etching using a resist mask.

Figure 10A:
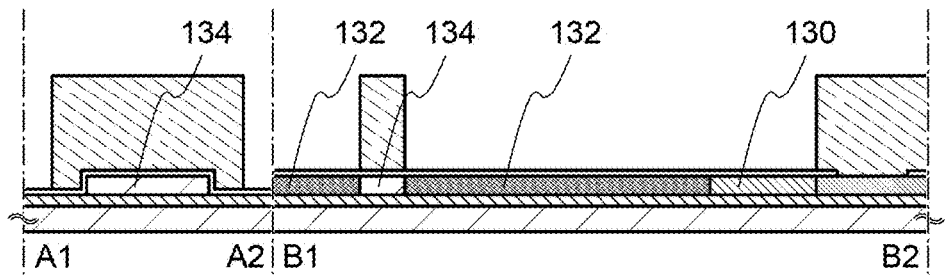
FIGS. 10A to 10D are cross-sectional views relating to manufacturing steps of a semiconductor device.

Next, an impurity element imparting one conductivity type is added to the semiconductor layer with the use of the gate electrode 128*a* and the conductive layer 128*b* as masks, so that the channel formation region 134, the impurity regions 132, and the impurity region 130 are formed (see FIG. 10A). Here, an impurity element such as boron (B) is added in order to form a p-channel transistor. In the case of forming an n-channel transistor, an impurity element such as phosphorus (P) or arsenic (As) may be added. Here, the concentration of an impurity element to be added can be set as appropriate. In addition, after the impurity element is added, heat treatment for activation is performed. The concentration of the impurity element in the impurity region is increased in the following order: the impurity region 126, the impurity region 132, and the impurity region 130.

Figure 10B:
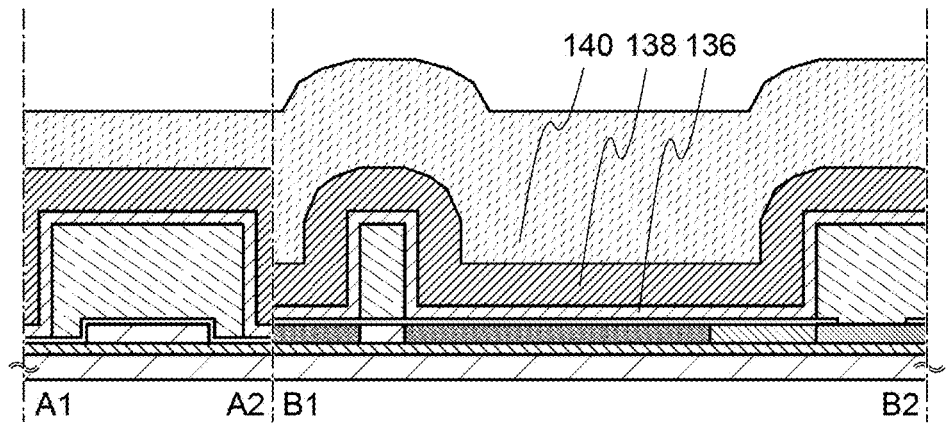

Next, the insulating layer 136, the insulating layer 138, and the insulating layer 140 are formed so as to cover the gate insulating layer 122*a*, the gate electrode 128*a*, and the conductive layer 128*b* (see FIG. 10B).

The insulating layer 136, the insulating layer 138, and the insulating layer 140 can be formed using a material including an inorganic insulating material such as silicon oxide, silicon oxynitride, silicon nitride oxide, silicon nitride, or aluminum oxide. The insulating layer 136, the insulating layer 138, and the insulating layer 140 are particularly preferably formed using a low dielectric constant (low-k) material, because capacitance due to overlapping electrodes or wirings can be sufficiently reduced. Note that the insulating layer 136, the insulating layer 138, and the insulating layer 140 may be porous insulating layers formed using any of these materials. Since the porous insulating layer has a low dielectric constant as compared to a dense insulating layer, capacitance due to electrodes or wirings can be further reduced. Alternatively, the insulating layer 136, the insulating layer 138, and the insulating layer 140 can be formed using an organic insulating material such as polyimide or acrylic. In this embodiment, the case of using silicon oxynitride for the insulating layer 136, silicon nitride oxide for the insulating layer 138, and silicon oxide for the insulating layer 140 will be described. A layered structure of the insulating layer 136, the insulating layer 138, and the insulating layer 140 is employed here; however, an embodiment of the disclosed invention is not limited to this. A single-layer structure, a layered structure of two layers, or a layered structure of four or more layers may be used.

Figure 10C:
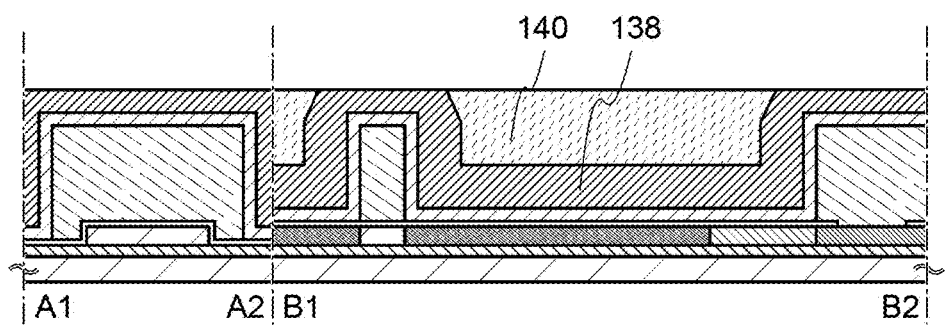

Next, the insulating layer 138 and the insulating layer 140 are subjected to chemical mechanical polishing (CMP) treatment, or etching treatment, so that the insulating layer 138 and the insulating layer 140 are planarized (see FIG. 10C). Here, CMP treatment is performed until the insulating layer 138 is partly exposed. When silicon nitride oxide is used for the insulating layer 138 and silicon oxide is used for the insulating layer 140, the insulating layer 138 functions as an etching stopper.

Figure 10D:
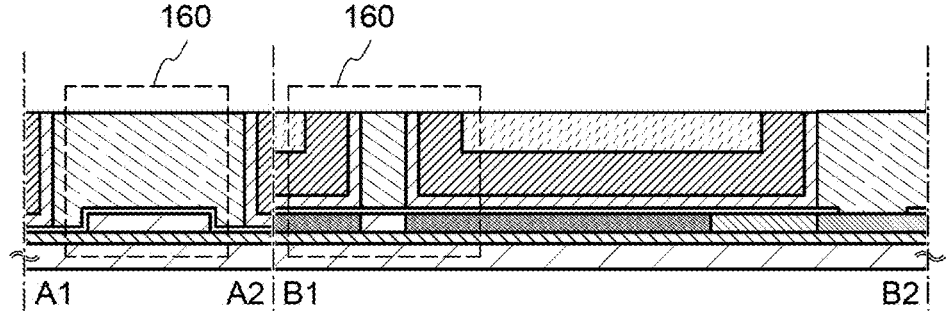

Next, the insulating layer 138 and the insulating layer 140 are subjected to CMP treatment or etching treatment, so that upper surfaces of the gate electrode 128a and the conductive layer 128b are exposed (see FIG. 10D). Here, etching treatment is performed until the gate electrode 128a and the conductive layer 128b are partly exposed. For the etching treatment, dry etching is preferably performed, but wet etching may also be performed. In the step of partly exposing the gate electrode 128a and the conductive layer 128b, in order to improve the characteristics of the transistor 162 which is formed later, the surfaces of the insulating layer 136, the insulating layer 138, and the insulating layer 140 are preferably planarized as much as possible.

Through the above steps, the transistor 160 in the lower portion can be formed (see FIG. 10D).

Note that before or after the above steps, a step for forming an additional electrode, wiring, semiconductor layer, insulating layer, or the like may be performed. For example, a multilayer wiring structure in which an insulating layer and a conductive layer are stacked is employed as a wiring structure, so that a highly integrated semiconductor device can be provided.

<Method for Manufacturing Transistor in Upper Portion>

Next, a method for manufacturing the transistor 162 in the upper portion will be described with reference to FIGS. 11A to 11D and FIGS. 12A to 12C.

Figure 11A:
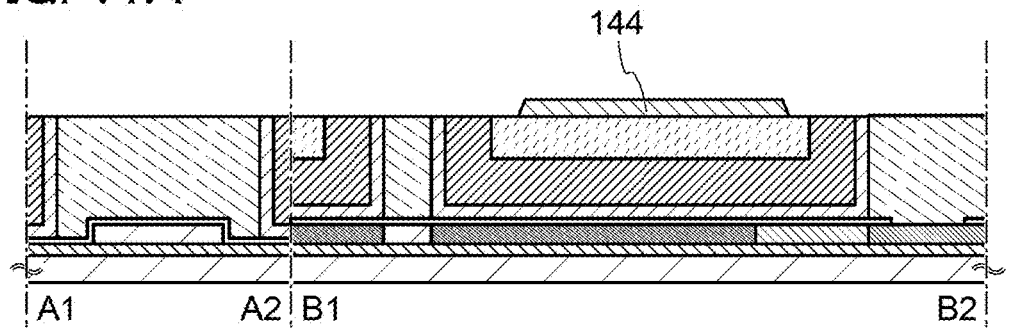
FIGS. 11A to 11D are cross-sectional views relating to manufacturing steps of a semiconductor device.

First, an oxide semiconductor layer is formed over the gate electrode 128a, the conductive layer 128b, the insulating layers 136, 138, and 140, and the like and is processed, so that the oxide semiconductor layer 144 is formed (see FIG. 11A). Note that an insulating layer functioning as a base may be formed over the insulating layer 136, the insulating layer 138, and the insulating layer 140 before the oxide semiconductor layer is formed. The insulating layer can be formed by a PVD method such as a sputtering method, or a CVD method such as a plasma CVD method.

As a material used for the oxide semiconductor layer, a four-component metal oxide material such as an In—Sn—Ga—Zn—O-based material; a three-component metal oxide material such as an In—Ga—Zn—O-based material, an In—Sn—Zn—O-based material, an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, or an In—Lu—Zn—O-based material; a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like can be used. In addition, the above materials may contain $SiO_2$. Here, for example, an In—Ga—Zn—O-based material means an oxide film containing indium (In), gallium (Ga), and zinc (Zn), and there is no particular limitation on the composition ratio. Further, the In—Ga—Zn—O-based oxide semiconductor may contain an element other than In, Ga, and Zn.

As the oxide semiconductor layer, a thin film including a material expressed as the chemical formula, $InMO_3(ZnO)_m$ (m>0), can be used. Here, M represents one or more metal elements selected from Ga, Al, Mn, and Co. For example, M may be Ga, Ga and Al, Ga and Mn, Ga and Co, or the like.

The thickness of the oxide semiconductor layer is preferably greater than or equal to 3 nm and less than or equal to 30 nm. This is because the transistor might be normally on when the oxide semiconductor layer is too thick (e.g., when the thickness is greater than or equal to 50 nm).

The oxide semiconductor layer is preferably formed by a method in which impurities such as hydrogen, water, a hydroxyl group, or hydride do not easily enter the oxide semiconductor layer. For example, a sputtering method or the like can be used.

In this embodiment, the oxide semiconductor layer is formed by a sputtering method with the use of an In—Ga—Zn—O-based oxide target.

As the In—Ga—Zn—O-based oxide target, for example, an oxide target having a composition ratio of $In_2O_3$:$Ga_2O_3$:ZnO=1:1:1 [molar ratio] can be used. Note that it is not necessary to limit the material and the composition ratio of the target to the above. For example, an oxide target having a composition ratio of $In_2O_3$:$Ga_2O_3$:ZnO=1:1:2 [molar ratio] can be used.

The filling rate of the oxide target is higher than or equal to 90% and lower than or equal to 100%, preferably, higher than or equal to 95% and lower than or equal to 99.9%. With the use of the metal oxide target with a high filling rate, a dense oxide semiconductor layer can be formed.

The film formation atmosphere may be a rare gas (typically argon) atmosphere, an oxygen atmosphere, or a mixed atmosphere containing a rare gas and oxygen. An atmosphere of a high-purity gas from which an impurity such as hydrogen, water, a hydroxyl group, or hydride is sufficiently removed is preferable, in order to prevent hydrogen, water, a hydroxyl group, hydride, or the like from entering the oxide semiconductor layer.

For example, the oxide semiconductor layer can be formed as follows.

First, the substrate is held in a film formation chamber which is kept under reduced pressure and then heated so that the substrate temperature reaches a temperature higher than 200° C. and lower than or equal to 500° C., preferably higher than 300° C. and lower than or equal to 500° C., more preferably higher than or equal to 350° C. and lower than or equal to 450° C.

Then, a high-purity gas from which impurities such as hydrogen, water, a hydroxyl group, or hydride are sufficiently removed is introduced into the film formation chamber from which remaining moisture is being removed, and the oxide semiconductor layer is formed over the substrate with the use of the above target. To remove moisture remaining in the film formation chamber, an entrapment vacuum pump such as a cryopump, an ion pump, or a titanium sublimation pump is desirably used as an evacuation unit. Further, the evacuation unit may be a turbo pump provided with a cold trap. In the film formation chamber which is evacuated with the cryopump, for example, impurities such as hydrogen, water, a hydroxyl group, or hydride (preferably, also a compound containing a carbon atom), or the like are removed, whereby the concentration of impurities such as hydrogen, water, a hydroxyl group, or hydride in the oxide semiconductor layer formed in the film formation chamber can be reduced.

In the case where the substrate temperature is low (for example, lower than or equal to 100° C.) during film formation, a substance including a hydrogen atom may enter the oxide semiconductor; thus, it is preferable that the substrate be heated at a temperature in the above range.

When the oxide semiconductor layer is formed with the substrate heated at the above temperature, the substrate temperature is increased, so that hydrogen bonds are cut by heat and a substance containing a hydrogen atom is less likely to be taken into the oxide semiconductor layer. Therefore, when the oxide semiconductor layer is formed with the substrate heated at the above temperature, the concentration of impurities such as hydrogen, water, a hydroxyl group, or hydride in the oxide semiconductor layer can be sufficiently reduced. Moreover, damage due to sputtering can be reduced.

As an example of the film formation conditions, the following conditions can be employed: the distance between the substrate and the target is 60 mm, the pressure is 0.4 Pa, the direct-current (DC) power source is 0.5 kW, the substrate temperature is 400° C., and the film formation atmosphere is an oxygen atmosphere (the proportion of the oxygen flow rate is 100%). Note that a pulse direct current power source is preferable because powder substances (also referred to as particles or dust) generated in film formation can be reduced and the film thickness can be uniform.

Note that before the oxide semiconductor layer is formed by a sputtering method, powdery substances (also referred to as particles or dust) attached on a formation surface of the oxide semiconductor layer are preferably removed by reverse sputtering in which an argon gas is introduced and plasma is generated. The reverse sputtering refers to a method in which a voltage is applied to a substrate side to generate plasma in the vicinity of the substrate to modify a surface. Note that instead of argon, a gas of nitrogen, helium, oxygen, or the like may be used.

The oxide semiconductor layer can be processed by being etched after a mask having a desired shape is formed over the oxide semiconductor layer. The mask may be formed by a method such as photolithography or an ink-jet method. For the etching of the oxide semiconductor layer, either wet etching or dry etching may be employed. It is needless to say that both of them may be employed in combination.

After that, heat treatment (first heat treatment) may be performed on the oxide semiconductor layer 144. The heat treatment eliminates substances including hydrogen atoms in the oxide semiconductor layer 144; thus, a structure of the oxide semiconductor layer 144 can be ordered and defect levels in the energy gap can be reduced. The heat treatment is performed in an inert gas atmosphere at higher than or equal to 250° C. and lower than or equal to 700° C., preferably higher than or equal to 450° C. and lower than or equal to 600° C. or lower than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is higher than or equal to 6 N (99.9999%), preferably higher than or equal to 7 N (99.99999%) (that is, the concentration of the impurities is lower than or equal to 1 ppm, preferably lower than or equal to 0.1 ppm).

The heat treatment can be performed in such a way that, for example, an object to be processed is introduced into an electric furnace in which a resistance heating element or the like is used and heated, in a nitrogen atmosphere at 450° C. for an hour. The oxide semiconductor layer 144 is not exposed to the air during the heat treatment so that entry of water and hydrogen can be prevented.

The impurities are reduced by the heat treatment, leading to formation of an i-type oxide semiconductor layer (an intrinsic oxide semiconductor layer) or a substantially i-type oxide semiconductor layer. Accordingly, a transistor having excellent characteristics can be realized.

The above heat treatment has an effect of removing hydrogen, water, and the like and can be referred to as dehydration treatment, dehydrogenation treatment, or the like. The heat treatment can be performed at the timing, for example, before the oxide semiconductor layer is processed to have an island shape, after the gate insulating film is formed, or the like. Such dehydration treatment or dehydrogenation treatment may be performed once or plural times.

Figure 11B:
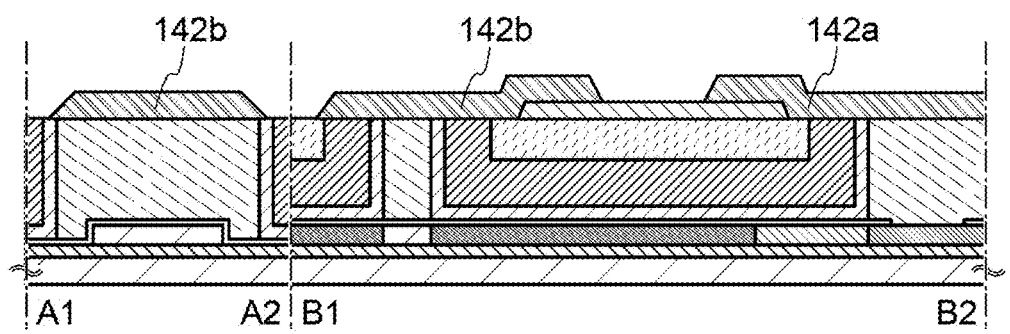

Next, a conductive layer for forming a source electrode and a drain electrode (including a wiring formed in the same layer as the source electrode and the drain electrode) is formed over the oxide semiconductor layer 144 and the like and is processed, so that the source electrode 142a and the drain electrode 142b are formed (see FIG. 11B).

The conductive layer can be formed by a PVD method or a CVD method. As a material for the conductive layer, an element selected from aluminum, chromium, copper, tantalum, titanium, molybdenum, and tungsten; an alloy containing any of these elements as its component; or the like can be used. Further, one or more materials selected from manganese, magnesium, zirconium, beryllium, neodymium, and scandium may be used.

The conductive layer can have a single-layer structure or a layered structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has a single-layer structure of a titanium film or a titanium nitride film, there is an advantage that the conductive layer is easily processed into the source electrode 142a and the drain electrode 142b having a tapered shape.

Alternatively, the conductive layer may be formed using conductive metal oxide. As the conductive metal oxide, indium oxide ($In_2O_3$), tin oxide ($SnO_2$), zinc oxide (ZnO), an alloy of indium oxide and tin oxide ($In_2O_3$—$SaO_2$, which is abbreviated to ITO in some cases), an alloy of indium oxide and zinc oxide ($In_2O_3$—ZnO), or any of these metal oxide materials in which silicon or silicon oxide is included can be used.

The conductive layer is preferably etched so that end portions of the source electrode 142a and the drain electrode 142b that are to be formed are tapered. Here, a taper angle is, for example, preferably greater than or equal to 30° and less than or equal to 60°. The etching is performed so that the end portions of the source electrode 142a and the drain electrode 142b are tapered, whereby coverage with the gate insulating layer 146 formed later can be improved and disconnection can be prevented.

The channel length (L) of the transistor in the upper portion is determined by a distance between lower end portions of the source electrode 142a and the drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet rays, the resolution is high and the focus depth is large. For these reasons, the channel length (L) of the transistor to be formed later can be in the range of greater than or equal to 10 nm and less than or equal to 1000 nm (1 µm), and the circuit can operate at higher speed. Moreover, miniaturization can lead to low power consumption of a semiconductor device.

As an example which is different from that in FIG. 11B, oxide conductive layers can be provided as a source region and a drain region, between the oxide semiconductor layer 144 and the source and drain electrodes.

For example, the oxide conductive layers which serve as a source region and a drain region, the source electrode 142a, and the drain electrode 142b can be formed by forming an oxide conductive film over the oxide semiconductor layer 144, forming a conductive layer over the oxide conductive film, and processing the oxide conductive film and the conductive layer in one photolithography step.

Alternatively, a stack of an oxide semiconductor film and an oxide conductive film is formed and the shape of the stack of the oxide semiconductor film and the oxide conductive film is processed by one photolithography step, so that the oxide semiconductor layer 144 and an oxide semiconductor film which have island shapes are formed. After the source electrode 142a and the drain electrode 142b are formed, the island-shaped oxide conductive film is etched using the source electrode 142a and the drain electrode 142b as masks, so that the oxide conducive layers which serve as a source region and a drain region can be formed.

For etching treatment for the processing the shape of the oxide conductive layer, the etching conditions (e.g., the kind and concentration of etching agent, and etching time) are adjusted as appropriate to prevent excessive etching of the oxide semiconductor layer.

A material of the oxide conductive layer preferably contains zinc oxide as its component and preferably does not contain indium oxide. For such an oxide conductive layer, zinc oxide, zinc aluminum oxide, zinc aluminum oxynitride, zinc gallium oxide, or the like can be used.

When the oxide conductive layers are provided between the oxide semiconductor layer and the source and drain electrodes, a source region and a drain region can have lower resistance and the transistor can operate at high speed.

With the structure of the oxide semiconductor layer 144, the oxide conductive layer, and the drain electrode formed using a metal material, the withstand voltage of the transistor can be further increased.

It is effective to use the oxide conductive layers for a source region and a drain region in order to improve frequency characteristics of a peripheral circuit (a driver circuit). The contact resistance can be reduced when a metal electrode (e.g., molybdenum or tungsten) and the oxide conductive layer are in contact, as compared to the case where a metal electrode (e.g., molybdenum or tungsten) and the oxide semiconductor layer are in contact. The contact resistance can be reduced by interposing the oxide conductive layers between the oxide semiconductor layer and the source and drain electrodes; accordingly, frequency characteristics of a peripheral circuit (a driver circuit) can be improved.

Figure 11C:
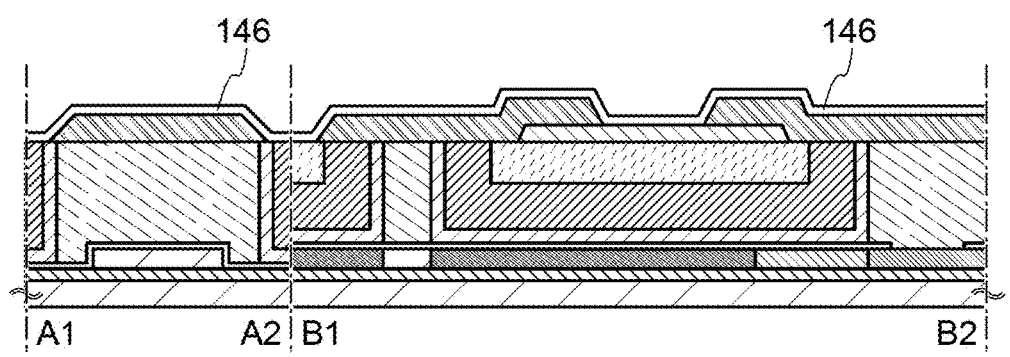

Next, the gate insulating layer 146 is formed so as to cover the source electrode 142a and the drain electrode 142b and to be in contact with part of the oxide semiconductor layer 144 (see FIG. 11C).

The gate insulating layer 146 can be formed by a CVD method, a sputtering method, or the like. The gate insulating layer 146 is preferably formed so as to contain silicon oxide, silicon nitride, silicon oxynitride, gallium oxide, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 146 may have a single-layer structure or a layered structure in which these elements are combined. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as in the above description, a problem of gate leakage due to a tunnel effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. By using a high-k material for the gate insulating layer 146, electric characteristics can be ensured and the thickness can be large to prevent gate leakage. Note that a layered structure of a film containing a high-k material and a film containing any one of silicon oxide, silicon nitride, silicon oxynitride, silicon nitride oxide, aluminum oxide, and the like may be employed.

Further, the insulating layer in contact with the oxide semiconductor layer 144 (in this embodiment, the gate insulating layer 146) may be an insulating material including a Group 13 element and oxygen. Many oxide semiconductor materials include a Group 13 element, and an insulating material including a Group 13 element has a good compatibility with an oxide semiconductor. By using an insulating material including a Group 13 element for the insulating layer in contact with the oxide semiconductor layer, an interface with the oxide semiconductor layer can be kept in a favorable state.

An insulating material including a Group 13 element refers to an insulating material including one or more Group 13 elements. As the insulating material containing a Group 13 element, gallium oxide, aluminum oxide, aluminum gallium oxide, gallium aluminum oxide, and the like are given, for example. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in forming a gate insulating layer in contact with an oxide semiconductor layer containing gallium, a material including gallium oxide may be used as the gate insulating layer, so that favorable characteristics can be kept at the interface between the oxide semiconductor layer and the gate insulating layer. When the oxide semiconductor layer and the insulating layer containing gallium oxide are provided in contact with each other, pileup of hydrogen at the interface between the oxide semiconductor layer and the insulating layer can be reduced, for example. Note that a similar effect can be obtained in the case where an element belonging to the same group as a constituent element of the oxide semiconductor is used for the insulating layer. It is also effective to form an insulating layer with the use of a material containing aluminum oxide, for example. Note that water is less likely to permeate aluminum oxide. Thus, it is preferable to use a material containing aluminum oxide in terms of preventing entry of water into the oxide semiconductor layer.

The insulating layer in contact with the oxide semiconductor layer 144 preferably includes oxygen in a proportion higher than that in the stoichiometric composition, by heat treatment in an oxygen atmosphere, oxygen doping, or the like. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in the case where the insulating layer in contact with the oxide semiconductor layer 144 is formed of gallium oxide, the composition of gallium oxide can be set to be $Ga_2O_x$ (x=3+a, 0<a<1) by heat treatment in an oxygen atmosphere or oxygen doping. In the case where the insulating layer which is in contact with the oxide semiconductor layer 144 is formed using aluminum oxide, the composition of aluminum oxide can be set to be $Al_2O_x$ (x=3+a, 0<a<1) by heat treatment in an oxygen atmosphere or oxygen doping. In the case where the insulating layer in contact with the oxide semiconductor layer 144 is formed using gallium aluminum oxide (or aluminum gallium oxide), the composition of gallium aluminum oxide (or aluminum gallium oxide) can be set to be $Ga_xAl_{2-x}O_{3+\alpha}$ (0<x<2, 0<α<1) by heat treatment in an oxygen atmosphere or oxygen doping.

By oxygen doping or the like, an insulating layer which includes a region where the proportion of oxygen is higher than that in the stoichiometric composition can be formed. When the insulating layer including such a region is in contact with the oxide semiconductor layer, oxygen that exists excessively in the insulating layer is supplied to the oxide semiconductor layer, and oxygen deficiency in the oxide semiconductor layer or at the interface between the oxide semiconductor layer and the insulating layer is reduced. Thus, the oxide semiconductor layer can be an i-type or substantially i-type oxide semiconductor.

The insulating layer which includes a region where the proportion of oxygen is higher than that in the stoichiometric composition may be applied to the insulating layer serving as a base film of the oxide semiconductor layer 144 instead of the gate insulating layer 146, or both the gate insulating layer 146 and the base insulating layer.

After the gate insulating layer 146 is formed, second heat treatment is desirably performed in an inert gas atmosphere or an oxygen atmosphere. The temperature of the heat treatment is set to be higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electric characteristics of the transistor. Further, in the case where the gate insulating layer 146 contains oxygen, oxygen is supplied to the oxide semiconductor layer 144 to compensate for oxygen deficiency in the oxide semiconductor layer 144, so that an i-type (intrinsic) or substantially i-type oxide semiconductor layer can be formed.

Note that in this embodiment, the second heat treatment is performed after the gate insulating layer 146 is formed; the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

By performing at least one of the first heat treatment and the second heat treatment as described above, the oxide semiconductor layer 144 can be highly purified so as to include a substance containing a hydrogen atom as few as possible.

Figure 11D:
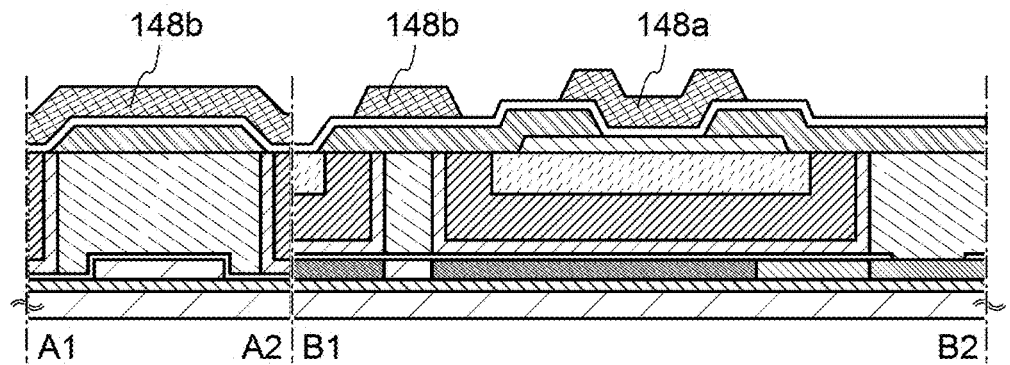

Next, a conductive layer for forming a gate electrode (including a wiring formed using the same layer as the gate electrode) is formed and is processed, so that the gate electrode 148a and the conductive layer 148b are formed (see FIG. 11D).

The gate electrode 148a and the conductive layer 148b can be formed using a metal material such as molybdenum, titanium, tantalum, tungsten, aluminum, copper, neodymium, or scandium, or an alloy material containing any of these metal materials as its main component. Note that the gate electrode 148a and the conductive layer 148b may have a single-layer structure or a layered structure.

Figure 12A:
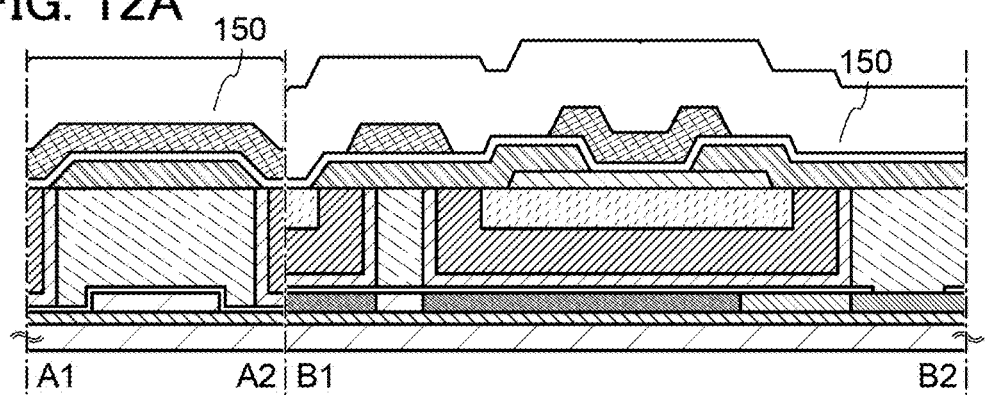
FIGS. 12A to 12C are cross-sectional views relating to manufacturing steps of a semiconductor device.
Figure 12B:
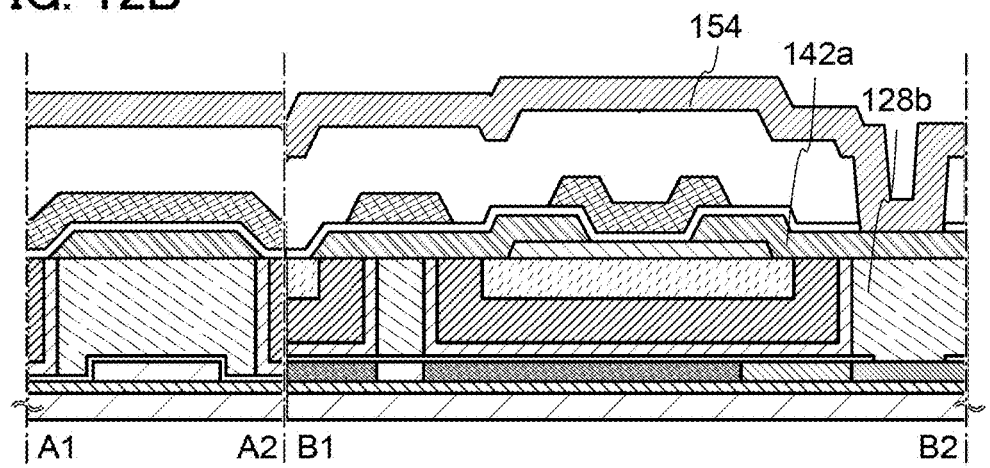

Then, the insulating layer 150 is formed over the gate insulating layer 146, the gate electrode 148a, and the conductive layer 148b (see FIG. 12A). The insulating layer 150 can be formed by a PVD method, a CVD method, or the like. The insulating layer 150 can be formed using a material including an inorganic insulating material such as silicon oxide, silicon oxynitride, silicon nitride, hafnium oxide, gallium oxide, or aluminum oxide. Note that for the insulating layer 150, a material with a low dielectric constant may be preferably used or a structure with a low dielectric constant (e.g., a porous structure) may be preferably employed. This is because by reducing the dielectric constant of the insulating layer 150, capacitance between wirings and electrodes can be reduced, which will increase operation speed. Note that although the insulating layer 150 has a single-layer structure in this embodiment, an embodiment of the disclosed invention is not limited to this. The insulating layer 150 may have a layered structure including two or more layers.

Next, an opening reaching the source electrode 142a is formed in the gate insulating layer 146 and the insulating layer 150. Then, the wiring 154 connected to the source electrode 142a is formed over the insulating layer 150 (see FIG. 12B). The opening is formed by selective etching using a mask or the like.

A conductive layer is formed by a PVD method or a CVD method and then is patterned, so that the wiring 154 is formed. As a material for the conductive layer, an element selected from aluminum, chromium, copper, tantalum, titanium, molybdenum, and tungsten; an alloy containing any of these elements as its component; or the like can be used. Further, one or more materials selected from manganese, magnesium, zirconium, beryllium, neodymium, and scandium may be used.

Specifically, it is possible to employ a method, for example, in which after a thin titanium film (with a thickness of about 5 nm) is formed in a region including the opening of the insulating layer 150 by a PVD method, an aluminum film is formed so as to fill the opening. Here, the titanium film formed by a PVD method has a function of reducing an oxide film (e.g., a native oxide film) formed on a surface where film formation is performed, to decrease contact resistance with a lower electrode (here, the source electrode 142a). In addition, hillock of an aluminum film can be prevented. A copy film may also be formed by a plating method after the formation of the barrier film of titanium, titanium nitride, or the like.

The opening formed in the insulating layer 150 is preferably formed in a region overlapping with the conductive layer 128b. With the opening in such a region, the element area can be prevented from increasing owing to contact regions A position where the impurity region 126 and the source electrode 142a are connected and a position where the source electrode 142a and the wiring 154 are connected may overlap with each other without using the conductive layer 128b; such a case will be described. In that case, an opening (also referred to as a contact in a lower portion) is formed in the insulating layer 136, the insulating layer 138, and the insulating layer 140 that are formed over the impurity region 126, and the source electrode 142a is formed in the contact in the lower portion. After that, an opening (also referred to as a contact in an upper portion) is formed in a region overlapping with the contact in the lower portion in the gate insulating layer 146 and the insulating layer 150, and then the wiring 154 is formed. When the contact in the upper portion is formed in the region overlapping with the contact in the lower portion, the source electrode 142a formed in the contact in the lower portion might be disconnected by etching. In order to avoid the disconnection, the contact in the lower portion and the contact in the upper portion are formed so as not to overlap with each other, so that a problem of the increase in the element area occurs.

As described in this embodiment, with the use of the conductive layer 128b, the contact in the upper portion can be formed without disconnection of the source electrode 142a. Thus, the contact in the lower portion and the contact in the upper portion can be formed overlapping with each other, so that the element area can be prevented from increasing owing to contact regions. In other words, the degree of integration of the semiconductor device can be increased.

Figure 12C:
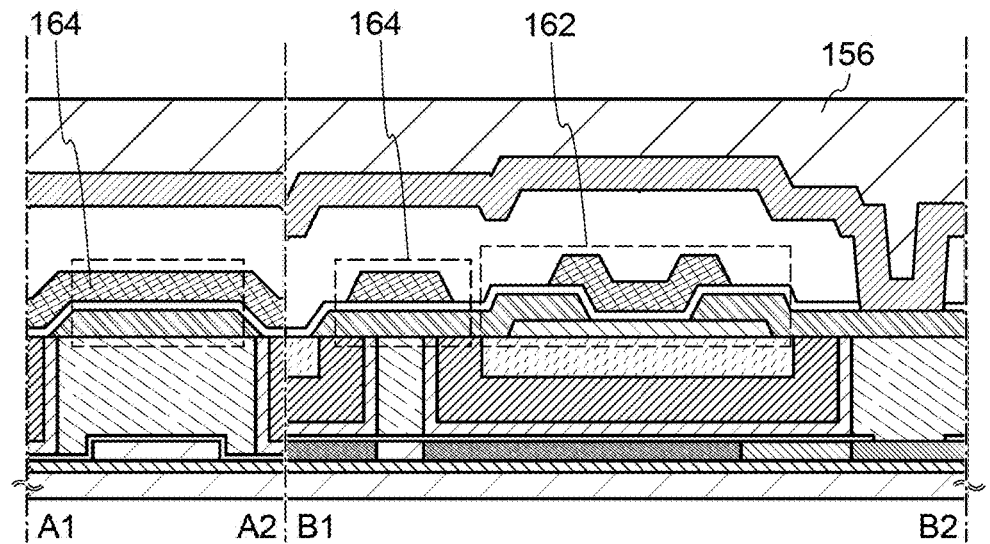

Next, an insulating layer 156 is formed so as to cover the wiring 154 (see FIG. 12C).

Through the above process, the transistor 162 including the highly purified oxide semiconductor layer 144 and the capacitor 164 are completed (see FIG. 12C).

The impurity region 126, the insulating layer 122, the conductive layer 128c, the conductive layer 142c, and the conductive layer 148c included in the capacitor 250 illustrated in FIG. 7 are formed at the same time as the impurity region 126, the gate insulating layer 122a, the gate electrode 128a, the source electrode 142a and the drain electrode 142b, and the gate electrode 148a of the transistor 160, the transistor 162, and the capacitor 164.

Next, an example of a transistor which can be used as the transistor 162 illustrated in FIGS. 6A and 6B is described.

Note that oxide conductive layers serving as a source region and a drain region may be provided between the oxide semiconductor layer 144 and the source electrode 142a and the drain electrode 142b, as buffer layers in the transistor 162. Transistors 441 and 442 each having the structure in which oxide conductive layers are provided in the transistor 162 in FIGS. 6A and 6B are illustrated in FIGS. 13A and 13B.

Figure 13A:
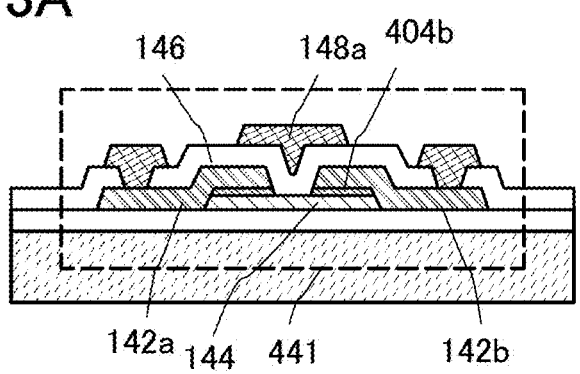
FIGS. 13A and 13B are each a cross-sectional view of a semiconductor device.
Figure 13B:
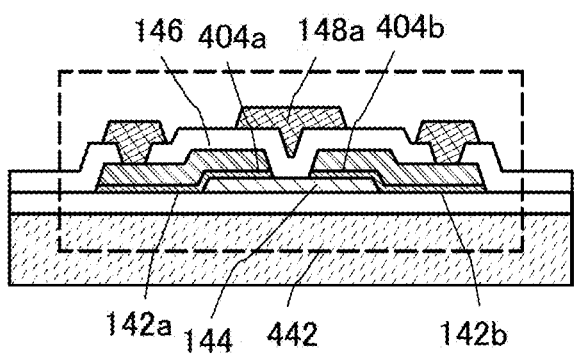

In each of the transistors 441 and 442 in FIGS. 13A and 13B, oxide conductive layers 404a and 404b serving as a source region and a drain region are provided between the oxide semiconductor layer 144 and the source electrode 142a and between the oxide semiconductor layer 144 and the drain electrode 142b. The shapes of the oxide conductive layers 404a and 404b are different between the transistors 441 and 442 of FIGS. 13A and 13B because of the difference between their manufacturing processes.

As for the transistor 441 of FIG. 13A, a stack of an oxide semiconductor film and an oxide conductive film is formed and the shape of the stack is processed to form the island-shaped oxide semiconductor layer 144 and the island-shaped oxide conductive film in one photolithography step. After the source electrode 142a and the drain electrode 142b are formed over the oxide semiconductor layer and the oxide conductive film, the island-shaped oxide conductive film is etched using the source electrode 142a and the drain electrode 142b as masks so that the oxide conductive layers 404a and 404b to be source and drain regions are formed.

In the transistor 442 in FIG. 13B, an oxide conductive film is formed over the oxide semiconductor layer 144, a metal conductive film is formed over the oxide conductive film, and the oxide conductive film and the metal conductive film are processed in one photolithography step; thus, the oxide conductive layer 404a and the oxide conductive layer 404b which serve as a source region and a drain region, the source electrode 142a, and the drain electrode 142b are formed.

For etching treatment for processing the shape of the oxide conductive layer, the etching conditions (e.g., the kind and concentration of etching agent, and etching time) are adjusted as appropriate to prevent excessive etching of the oxide semiconductor layer.

As the formation method of the oxide conductive layers 404a and 404b, a sputtering method, a vacuum evaporation method (an electron beam evaporation method or the like), an arc discharge ion plating method, or a spray method is used. As a material of the oxide conductive layers, zinc oxide, zinc aluminum oxide, zinc aluminum oxynitride, zinc gallium oxide, indium tin oxide containing silicon oxide, or the like can be used. In addition, the above materials may include silicon oxide.

When the oxide conductive layers are provided as the source region and the drain region between the oxide semiconductor layer 144 and the source electrode 142a and between the oxide semiconductor layer 144 and the drain electrode 142b, the source region and the drain region can have lower resistance and the transistors 441 and 442 can operate at high speed.

With the structure including the oxide semiconductor layer 144, the oxide conductive layers 404a and 404b, the source electrode 142a, and the drain electrode 142b, withstand voltages of the transistors 441 and 442 can be improved.

Figure 14A:
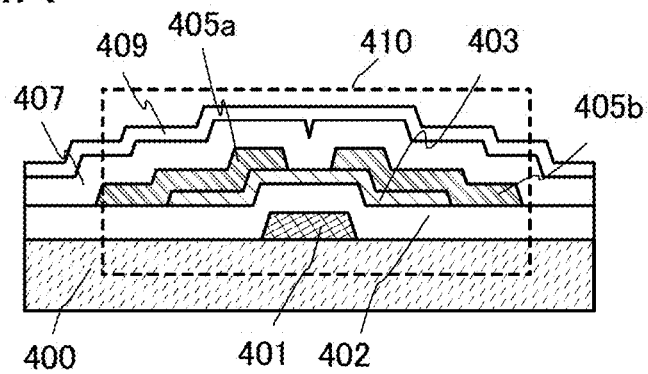
FIGS. 14A to 14C are each a cross-sectional view of a semiconductor device.
Figure 14B:
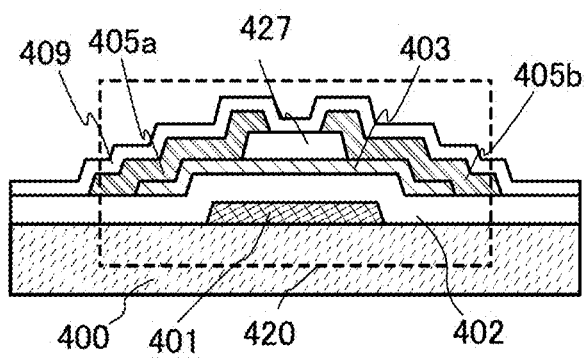
Figure 14C:
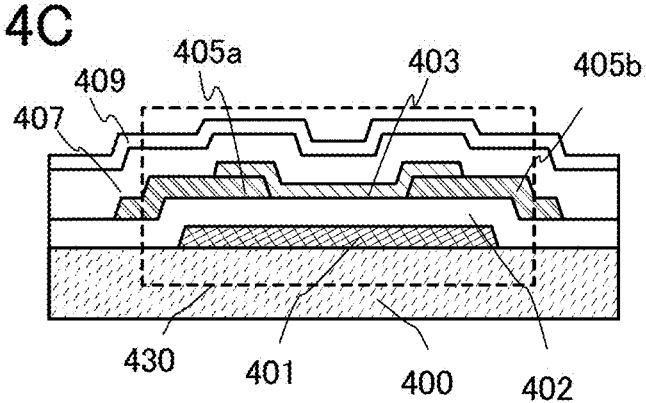

A top gate structure is employed as the structure of the transistor 162 illustrated in FIGS. 6A and 6B; however, an embodiment of the present invention is not limited thereto, and a bottom gate structure may be employed. FIGS. 14A to 14C illustrate examples of a bottom gate structure.

In a transistor 410 illustrated in FIG. 14A, a gate insulating layer 402 is provided over the gate electrode 401, an oxide semiconductor layer 403 is provided over the gate insulating layer 402, and a source electrode 405a and a drain electrode 405b which are connected to the oxide semiconductor layer 403 are provided. Note that the gate electrode 401, the oxide semiconductor layer 403, the gate insulating layer 402, the source electrode 405a, and the drain electrode 405b correspond to the gate electrode 148a, the oxide semiconductor layer 144, the gate insulating layer 146, the source electrode 142a, and the drain electrode 142b in FIGS. 6A and 6B, respectively. Note that an insulating layer 400 corresponds to the insulating layer 136, the insulating layer 138, the insulating layer 140, or the like.

A transistor 420 illustrated in FIG. 14B is the same as the transistor of FIG. 14A in that the gate electrode 401, the gate insulating layer 402, the oxide semiconductor layer 403, the source electrode 405a, and the drain electrode 405b are provided. The transistor in FIG. 14B is different from the transistor in FIG. 14A in that an insulating layer 427 is provided in contact with the oxide semiconductor layer 403.

A transistor 430 illustrated in FIG. 14C is the same as the transistor of FIG. 14A in that the gate electrode 401, the gate insulating layer 402, the oxide semiconductor layer 403, the source electrode 405a, and the drain electrode 405b are provided. A different point of the transistor in FIG. 14C from the transistor in FIG. 14A is positions where the source electrode 405a and the drain electrode 405b are in contact with the oxide semiconductor layer 403. In other words, the source electrode 405a and the drain electrode 405b are provided over and in contact with the oxide semiconductor layer 403 in the transistor 410 illustrated in FIG. 14A, whereas the source electrode 405a and the drain electrode 405b are provided below and in contact with the oxide semiconductor layer 403 in the transistor 430 illustrated in FIG. 14C.

Since the oxide semiconductor layer 144 is highly purified in the transistor 162 illustrated in this embodiment, the hydrogen concentration therein is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$. In addition, the carrier density of the oxide semiconductor layer 144 is sufficiently low (e.g., lower than $1 \times 10^{12}$/cm$^3$, preferably lower than $1.45 \times 10^{10}$/cm$^3$) as compared to that of a general silicon wafer (approximately $1 \times 10^{14}$/cm$^3$). Accordingly, the off-state current of the transistor 162 is also sufficiently small. For example, the off-state current (here, current per micrometer (μm) of channel width) at room temperature (25° C.) is lower than or equal to 100 zA (1 zA (zeptoampere) is $1 \times 10^{-21}$ A), preferably lower than or equal to 10 zA.

With the use of the highly purified intrinsic oxide semiconductor layer 144, the off-state current of the transistor can be sufficiently reduced easily. Then, by using such a transistor, a semiconductor device in which stored data can be held for an extremely long time can be obtained.

The structures, methods, and the like described in this embodiment can be combined as appropriate with any of the structures, methods, and the like described in the other embodiments.

Embodiment 5

Figure 15A:
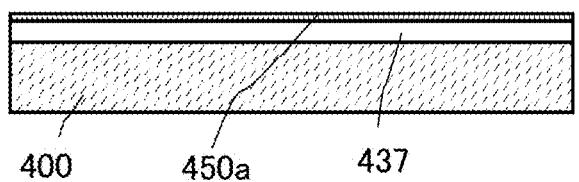
FIGS. 15A to 15C are cross-sectional views relating to manufacturing steps of a semiconductor device.
Figure 15B:
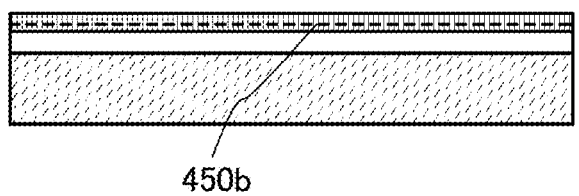

An embodiment of an oxide semiconductor layer which can be used as the semiconductor layer of any of the transistors in the above embodiments will be described with reference to FIGS. 15A to 15C.

The oxide semiconductor layer of this embodiment has a structure including a first crystalline oxide semiconductor layer and a second crystalline oxide semiconductor layer which is stacked over the first crystalline oxide semiconductor layer and is thicker than the first crystalline oxide semiconductor layer.

An insulating layer 437 is formed over an insulating layer 400. In this embodiment, an oxide insulating layer with a thickness of greater than or equal to 50 nm and less than or equal to 600 nm is formed as the insulating layer 437 by a PCVD method or a sputtering method. For example, a single layer selected from a silicon oxide film, a gallium oxide film, an aluminum oxide film, a silicon nitride film, a silicon oxynitride film, an aluminum oxynitride film, and a silicon nitride oxide film or a stack of any of these films can be used. Note that the insulating layer 400 corresponds to the insulating layer 136, the insulating layer 138, the insulating layer 140, or the like.

Next, a first oxide semiconductor film with a thickness of greater than or equal to 1 nm and less than or equal to 10 nm is formed over the insulating layer 437. The first oxide semiconductor film is formed by a sputtering method, and the substrate temperature in the film formation by a sputtering method is set to higher than or equal to 200° C. and lower than or equal to 400° C.

In this embodiment, the first oxide semiconductor film is formed with a thickness of 5 nm in an oxygen atmosphere, an argon atmosphere, or a mixed atmosphere of argon and oxygen under conditions that a target for an oxide semiconductor (a target for an In—Ga—Zn—O-based oxide semiconductor containing In$_2$O$_3$, Ga$_2$O$_3$, and ZnO at 1:1:2 [molar ratio]) is used, the distance between the substrate and the target is 170 mm, the substrate temperature is 250° C., the pressure is 0.4 Pa, and the direct current (DC) power source is 0.5 kW.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 450a is formed (see FIG. 15A).

Although depending on the temperature of the first heat treatment, the first heat treatment causes crystallization from a film surface and crystal grows from the film surface toward the inside of the film; thus, c-axis aligned crystal is obtained. By the first heat treatment, large amounts of zinc and oxygen gather to the film surface, and one or more layers of graphene-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor layer 450a or the vicinity of the interface (within ±5 nm from the interface), whereby oxygen deficiency in the first crystalline oxide semiconductor layer is reduced. Therefore, it is preferable that oxygen be included in (in a bulk of) the insulating layer 437 used as a base insulating layer or at the interface between the first crystalline oxide semiconductor layer 450a and the insulating layer 437 at an amount that exceeds at least the amount of oxygen in the stoichiometric composition ratio.

Next, a second oxide semiconductor film with a thickness of more than 10 nm is formed over the first crystalline oxide semiconductor layer 450a. The second oxide semiconductor film is formed by a sputtering method, and the substrate temperature in the film formation is set to higher than or equal to 200° C. and lower than or equal to 400° C. By setting the substrate temperature in the film formation to higher than or equal to 200° C. and lower than or equal to 400° C., precursors can be arranged in the oxide semiconductor layer formed over and in contact with the surface of the first crystalline oxide semiconductor layer and so-called orderliness can be obtained.

In this embodiment, the second oxide semiconductor film is formed with a thickness of 25 nm in an oxygen atmosphere, an argon atmosphere, or a mixed atmosphere of argon and oxygen under conditions that a target for an oxide semiconductor (a target for an In—Ga—Zn—O-based oxide semiconductor containing $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the direct current (DC) power source is 0.5 kW.

Then, second heat treatment is performed by setting an atmosphere in a chamber where the substrate is placed to a nitrogen atmosphere or dry air. The temperature of the second heat treatment is higher than or equal to 400° C. and lower than or equal to 750° C. With the second heat treatment, a second crystalline oxide semiconductor layer 450b is formed (see FIG. 15B). The second heat treatment is performed in a nitrogen atmosphere, an oxygen atmosphere, or a mixed atmosphere of argon and oxygen, whereby the density of the second crystalline oxide semiconductor layer is increased and the number of defects therein is reduced. By the second heat treatment, crystal growth proceeds in the thickness direction with the use of the first crystalline oxide semiconductor layer 450a as a nucleus, that is, crystal growth proceeds from the bottom to the inside; thus, the second crystalline oxide semiconductor layer 450b is formed.

It is preferable that steps from the formation of the insulating layer 437 to the second heat treatment be successively performed without exposure to the air. The steps from the formation of the insulating layer 437 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of lower than or equal to −40° C., preferably a dew point of lower than or equal to −50° C. may be employed.

Figure 15C:
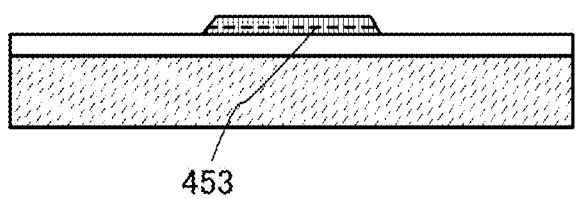

Next, the stack of the oxide semiconductor layers, the first crystalline oxide semiconductor layer 450a and the second crystalline oxide semiconductor layer 450b, is processed into an oxide semiconductor layer 453 including a stack of island-shaped oxide semiconductor layers (see FIG. 15C). In the drawing, the interface between the first crystalline oxide semiconductor layer 450a and the second crystalline oxide semiconductor layer 450b is indicated by a dotted line, and the first crystalline oxide semiconductor layer 450a and the second crystalline oxide semiconductor layer 450b are illustrated as a stack of oxide semiconductor layers; however, the interface is actually not distinct and is illustrated for easy understanding.

The stack of the oxide semiconductor layers can be processed by etching after a mask having a desired shape is formed over the stack of the oxide semiconductor layers. The mask may be formed by a method such as photolithography or an ink-jet method.

For the etching of the stack of the oxide semiconductor layers, either wet etching or dry etching may be employed. It is needless to say that both of them may be employed in combination.

One of features of the first and second crystalline oxide semiconductor layers obtained by the above formation method is that they have c-axis alignment. Note that the first crystalline oxide semiconductor layer and the second crystalline oxide semiconductor layer comprise an oxide including a crystal with c-axis alignment (also referred to as C-Axis Aligned Crystal (CAAC)), which has neither a single crystal structure nor an amorphous structure. The first crystalline oxide semiconductor layer and the second crystalline oxide semiconductor layer partly include a crystal grain boundary.

Note that the first crystalline oxide semiconductor layer and the second crystalline oxide semiconductor layer are each formed using an oxide material including at least Zn. For example, a four-component metal oxide such as an In—Al—Ga—Zn—O-based material or an In—Sn—Ga—Zn—O-based material; a three-component metal oxide such as an In—Ga—Zn—O-based material, an In—Al—Zn—O-based material, an In—Sn—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, or an In—Lu—Zn—O-based material; a two-component metal oxide such as an In—Zn—O-based material, a Sn—Zn—O-based material, an Al—Zn—O-based material, or a Zn—Mg—O-based material; a Zn—O-based material; or the like can be used. In addition, an In—Si—Ga—Zn—O-based material, an In—Ga—B—Zn—O-based material, or an In—B—Zn—O-based material may be used. In addition, the above materials may contain $SiO_2$. Here, for example, an In—Ga—Zn—O-based material means an oxide film containing indium (In), gallium (Ga), and zinc (Zn), and there is no particular limitation on the composition ratio. Further, the In—Ga—Zn—O-based oxide semiconductor may contain an element other than In, Ga, and Zn.

Without limitation to the two-layer structure in which the second crystalline oxide semiconductor layer is formed over the first crystalline oxide semiconductor layer, a layered structure including three or more layers may be formed by repeatedly performing a process of film formation and heat treatment for forming a third crystalline oxide semiconductor layer after the second crystalline oxide semiconductor layer is formed.

The oxide semiconductor layer 453 including the stack of the oxide semiconductor layers formed by the above formation method can be used as appropriate for a transistor (e.g., the transistor 162 in Embodiments 1 to 4 or the transistors 410, 420, 430, 441, and 442 in Embodiment 4) which can be applied to a semiconductor device disclosed in this specification.

In the transistor 162 in Embodiment 4, in which the stack of the oxide semiconductor layers of this embodiment is used as the oxide semiconductor layer 403, an electric field is not applied from one surface to the other surface of the oxide semiconductor layer and current does not flow in the thickness direction (from one surface to the other surface, specifically, in the vertical direction in the transistor 162 in FIGS. 6A and 6B) of the stack of the oxide semiconductor layers. The transistor has a structure in which current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with the use of a stack of a first crystalline oxide semiconductor layer and a second crystalline oxide semiconductor layer, like the oxide semiconductor layer 453, the transistor can have stable electric characteristics and high reliability.

This embodiment can be implemented in appropriate combination with the structures described in the other embodiments.

Embodiment 6

In this embodiment, the cases where the semiconductor device described in any of the above embodiments is applied to an electronic device will be described with reference to FIGS. 16A to 16F. In this embodiment, the semiconductor device described in any of the above embodiments can be applied to an electronic device such as computer, a mobile phone set (also referred to as a mobile phone or a mobile phone device), a personal digital assistant (including a portable game machine, an audio reproducing device, and the like), a camera such as a digital camera or a digital video camera, an electronic paper, or a television device (also referred to as a television or a television receiver).

Figure 16A:
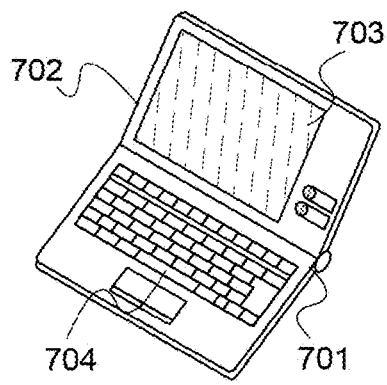
FIGS. 16A to 16F are each a diagram of an electronic device.

FIG. 16A illustrates a laptop computer including a housing 701, a housing 702, a display portion 703, a keyboard 704, and the like. The semiconductor device described in any of the above embodiments is provided in at least one of the housing 701 and the housing 702. Therefore, a laptop personal computer in which writing and reading of data are performed at high speed, data is stored for a long time, and power consumption is sufficiently reduced can be realized.

Figure 16B:
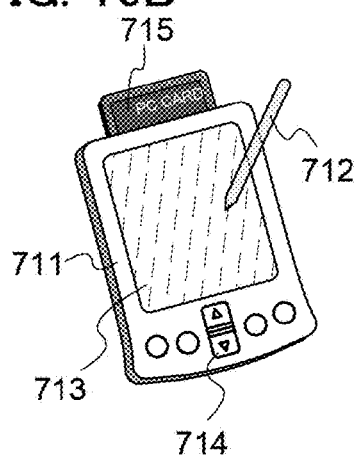

FIG. 16B illustrates a personal digital assistant (PDA). A main body 711 is provided with a display portion 713, an external interface 715, operation buttons 714, and the like. Further, a stylus 712 and the like for operation of the personal digital assistant are provided. In the main body 711, the semiconductor device described in any of the above embodiments is provided. Therefore, a personal digital assistant in which writing and reading of data are performed at high speed, data is stored for a long time, and power consumption is sufficiently reduced can be realized.

Figure 16C:
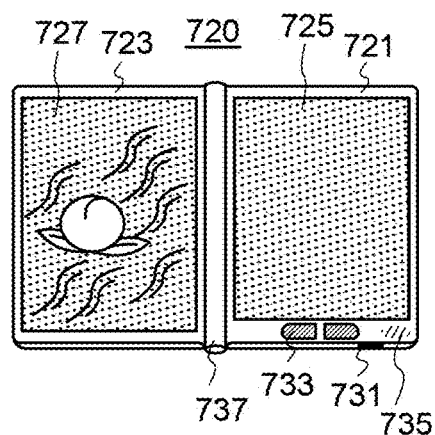

FIG. 16C illustrates an e-book reader 720 mounted with an electronic paper, which includes two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737 as an axis. The housing 721 is provided with a power supply 731, an operation key 733, a speaker 735, and the like. At least one of the housings 721 and 723 is provided with the semiconductor device described in any of the above embodiments. Therefore, an e-book reader in which writing and reading of data are performed at high speed, data is stored for a long time, and power consumption is sufficiently reduced can be realized.

Figure 16D:
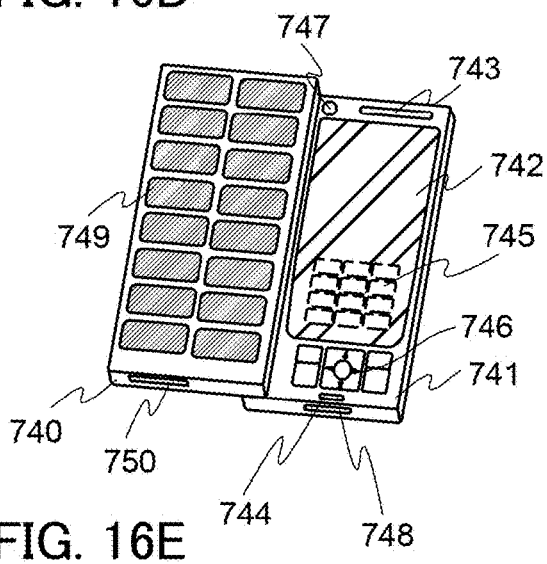

FIG. 16D illustrates a mobile phone set including two housings of a housing 740 and a housing 741. Further, the housing 740 and the housing 741 in a state where they are developed as illustrated in FIG. 16D can shift by sliding so that one is lapped over the other; therefore, the size of the mobile phone can be reduced, which makes the mobile phone suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the mobile phone set, an external memory slot 750, and the like. In addition, an antenna is incorporated in the housing 741. At least one of the housings 740 and 741 is provided with the semiconductor device described in any of the above embodiments. Therefore, a mobile phone set in which writing and reading of data are performed at high speed, data is stored for a long time, and power consumption is sufficiently reduced can be realized.

Figure 16E:
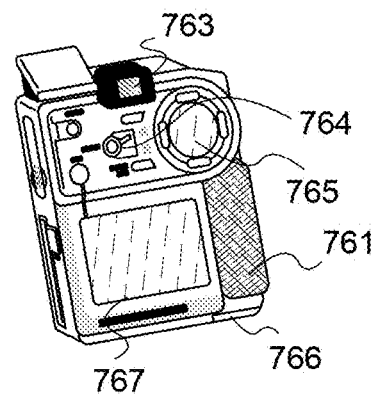

FIG. 16E illustrates a digital camera including a main body 761, a display portion 767, an eyepiece portion 763, an operation switch 764, a display portion 765, a battery 766, and the like. In the main body 761, the semiconductor device described in any of the above embodiments is provided. Therefore, a digital camera in which writing and reading of data are performed at high speed, data is stored for a long time, and power consumption is sufficiently reduced can be realized.

Figure 16F:
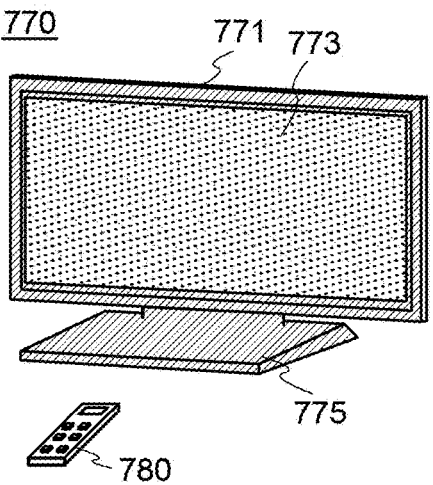

FIG. 16F illustrates a television set 770 which includes a housing 771, a display portion 773, a stand 775, and the like. The television set 770 can be operated with a switch of the housing 771 or a remote controller 780. The semiconductor device described in any of the above embodiments is mounted on the housing 771 and the remote controller 780. Therefore, a television set in which writing and reading of data are performed at high speed, data is stored for a long time, and power consumption is sufficiently reduced can be realized.

As described above, the electronic devices described in this embodiment each include the semiconductor device described in any of the above embodiments; thus, electronic devices with low power consumption can be realized.

This application is based on Japanese Patent Application serial no. 2010-204419 filed with Japan Patent Office on Sep. 13, 2010, the entire contents of which are hereby incorporated by reference.

What is claimed is:
1. A semiconductor device comprising:
   a memory cell array comprising a memory cell comprising:
      a first transistor comprising a first gate electrode, a first source electrode, a first drain electrode, and a first channel formation region; and
      a second transistor comprising a second gate electrode, a second source electrode,
   a second drain electrode, and a second channel formation region;
   a write word line;
   a driver circuit; and
   a noise removal circuit comprising a capacitor,
   wherein the first gate electrode and the second drain electrode are electrically connected to each other,
   wherein the noise removal circuit is outside of the memory cell array and the driver circuit,
   wherein the write word line is electrically connected to the driver circuit, the second gate electrode, and one electrode of the capacitor.
2. The semiconductor device according to claim 1,
   wherein the capacitor comprises a first conductive layer, a second insulating layer over the first conductive layer, a second conductive layer over the second insulating layer, and a third conductive layer in contact with the second conductive layer,
   wherein the first conductive layer comprises a silicon,
   wherein the second insulating layer is provided in the same layer as a gate insulating layer of the first transistor,
   wherein the second conductive layer is provided in the same layer as the first gate electrode, and wherein the third conductive layer is provided in the same layer as the second source electrode and the second drain electrode.

3. The semiconductor device according to claim 1, further comprising a first insulating layer between the first transistor and the second transistor,
wherein the first channel formation region comprises a silicon, and
wherein the second channel formation region comprises an oxide semiconductor.

4. The semiconductor device according to claim 1, wherein the capacitor and a resistor are provided between the driver circuit and the memory cell, the one electrode of the capacitor is electrically connected to the second gate electrode and one terminal of the resistor, and the other terminal of the resistor is electrically connected to the driver circuit.

5. The semiconductor device according to claim 4, wherein off-state current of the second transistor is less than or equal to 10 zA at room temperature (25° C.).

6. A semiconductor device comprising:
a memory cell comprising:
a first transistor;
a first insulating layer over the first transistor; and
a second transistor over the first insulating layer; and
a driver circuit,
wherein the first transistor comprises a first gate electrode, a first source electrode, a first drain electrode, and a first channel formation region,
wherein the second transistor comprises a second gate electrode, a second source electrode, a second drain electrode, and a second channel formation region,
wherein the first channel formation region comprises a silicon,
wherein the second channel formation region comprises an oxide semiconductor,
wherein the first gate electrode and the second drain electrode are electrically connected to each other,
wherein the driver circuit is electrically connected to the second gate electrode,
wherein the driver circuit comprises a noise removal circuit electrically connected to the second gate electrode,
wherein the noise removal circuit comprises a first inverter circuit, a second inverter circuit, and a capacitor,
wherein one electrode of the capacitor is electrically connected to an output terminal of the first inverter circuit and an input terminal of the second inverter circuit,
wherein an output terminal of the second inverter circuit is electrically connected to the second gate electrode,
wherein the capacitor comprises a first conductive layer, a second insulating layer over the first conductive layer, a second conductive layer over the second insulating layer, a third conductive layer in contact with the second conductive layer, and a fourth conductive layer in contact with the third conductive layer,
wherein the second insulating layer is provided in the same layer as a gate insulating layer of the first transistor,
wherein the second conductive layer is provided in the same layer as the first gate electrode,
wherein the third conductive layer is provided in the same layer as the second source electrode and the second drain electrode, and wherein the fourth conductive layer is provided in the same layer as the second gate electrode.

7. The semiconductor device according to claim 6, wherein the first conductive layer comprises a silicon.

8. The semiconductor device according to claim 6, wherein off-state current of the second transistor is less than or equal to 10 zA at room temperature (25° C.).

9. The semiconductor device according to claim 6, wherein the noise removal circuit comprises a resistor, wherein one terminal of the resistor is electrically connected to the output terminal of the first inverter circuit, and
wherein the other terminal of the resistor is electrically connected to the input terminal of the second inverter circuit.

10. The semiconductor device according to claim 9, wherein off-state current of the second transistor is less than or equal to 10 zA at room temperature (25° C.).

11. A semiconductor device comprising:
a memory cell comprising:
a first transistor;
a first insulating layer over the first transistor; and
a second transistor over the first insulating layer; and
a driver circuit,
wherein the first transistor comprises a first gate electrode, a first source electrode, a first drain electrode, and a first channel formation region,
wherein the second transistor comprises a second gate electrode, a second source electrode, a second drain electrode, and a second channel formation region,
wherein the first channel formation region comprises a silicon,
wherein the second channel formation region comprises an oxide semiconductor,
wherein the first gate electrode and the second drain electrode are electrically connected to each other,
wherein the driver circuit is electrically connected to the second gate electrode,
wherein the driver circuit comprises a noise removal circuit electrically connected to the second gate electrode,
wherein the noise removal circuit comprises an AND circuit and a capacitor,
wherein one electrode of the capacitor is electrically connected to a first input terminal of the AND circuit,
wherein an output terminal of the AND circuit is electrically connected to the second gate electrode,
wherein the capacitor comprises a first conductive layer, a second insulating layer over the first conductive layer, a second conductive layer over the second insulating layer, a third conductive layer in contact with the second conductive layer, and a fourth conductive layer in contact with the third conductive layer,
wherein the second insulating layer is provided in the same layer as a gate insulating layer of the first transistor,
wherein the second conductive layer is provided in the same layer as the first gate electrode,
wherein the third conductive layer is provided in the same layer as the second source electrode and the second drain electrode, and
wherein the fourth conductive layer is provided in the same layer as the second gate electrode.

12. The semiconductor device according to claim 11, wherein the first conductive layer comprises a silicon.

13. The semiconductor device according to claim 11, wherein off-state current of the second transistor is less than or equal to 10 zA at room temperature (25° C.).

14. The semiconductor device according to claim 11,
   wherein the noise removal circuit comprises a resistor,
   wherein one terminal of the resistor is electrically connected to the first input terminal of the AND circuit, and
   wherein the other terminal of the resistor is electrically connected to a second input terminal of the AND circuit.

15. The semiconductor device according to claim 14, wherein off-state current of the second transistor is less than or equal to 10 zA at room temperature (25° C.).

* * * * *